United States Patent
Hidaka

(10) Patent No.: US 6,912,174 B2
(45) Date of Patent: Jun. 28, 2005

(54) THIN FILM MAGNETIC MEMORY DEVICE SUPPRESSING INFLUENCE OF MAGNETIC FIELD NOISE FROM POWER SUPPLY WIRING

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/625,644

(22) Filed: Jul. 24, 2003

(65) Prior Publication Data

US 2004/0170076 A1 Sep. 2, 2004

(30) Foreign Application Priority Data

Feb. 27, 2003 (JP) ........................................ 2003-050523

(51) Int. Cl.$^7$ ............................ G11C 8/00; G11C 11/00
(52) U.S. Cl. .................. 365/230.06; 365/158; 365/171; 365/206; 365/226
(58) Field of Search ......................... 365/63, 158, 171, 365/173, 206, 226, 230.06

(56) References Cited

U.S. PATENT DOCUMENTS

| | | | | |
|---|---|---|---|---|
| 5,894,447 A | * | 4/1999 | Takashima | .................. 365/158 |
| 6,618,317 B1 | * | 9/2003 | Tsuji et al. | ............. 365/230.07 |
| 6,795,335 B2 | * | 9/2004 | Hidaka | ........................ 365/158 |
| 6,856,538 B2 | * | 2/2005 | Hidaka | ........................ 365/171 |
| 2003/0081450 A1 | | 5/2003 | Hidaka | |
| 2003/0235070 A1 | * | 12/2003 | Ooishi | ........................ 365/158 |

OTHER PUBLICATIONS

Scheurlein, et al. "A 10ns Read and Write Non–Volatile Memory Array Using a Magnetic Tunnel Junction and FET Switch in Each Cell" IEEE International Solid–State Circuits Conference (2000) TA 7.2.

Durlam, et al. "Nonvolatile RAM Based on Magnetic Tunnel Junction Elements" IEEE International Solid–State Circuits Conference (2000) TA 7.3.

Naji, et al. "A 256kb 3.0V 1T1MJT Nonvolatile Magnetoresistive RAM" IEEE International Solid–State Circuits Conference (2001) TA 7.6.

* cited by examiner

*Primary Examiner*—Son Mai
(74) *Attorney, Agent, or Firm*—McDermott Will & Emery LLP

(57) ABSTRACT

A main power supply line and a main ground wiring provided to supply power from one side (a first direction) of a memory region, a main power supply line and a main ground wiring provided to supply the power from the other side (a second direction opposite to the first direction) of the memory region are provided in a column direction. A bit line driver arranged on one side is supplied with power from one side, and a bit line driver arranged on the other side is supplied with the power from the other side. As a result, no current path is formed in a region of the power supply lines on the selected memory region.

11 Claims, 15 Drawing Sheets

THIN FILM MAGNETIC MEMORY DEVICE SUPPRESSING INFLUENCE OF MAGNETIC FIELD NOISE FROM POWER SUPPLY WIRING

BACKGROUND OF THE INVENTION

1. Field of the Invention

The present invention relates to a thin film magnetic memory device, and more particularly, to a random access memory including memory cells using a magnetic tunneling junction (MTJ).

2. Description of the Background Art

Recently, attention has been paid to an MRAM (Magnetic Random Access Memory) device as a new generation nonvolatile memory device. The MRAM device is a nonvolatile memory device which stores data in a nonvolatile manner using a plurality of thin film magnetic elements formed on a semiconductor integrated circuit and which enables each thin film magnetic element to be randomly accessed. It is made public that the performance of the MRAM device is surprisingly developed particularly by using thin film magnetic elements utilizing a magnetic tunneling junction (MTJ) as memory cells in "A 10 ns Read and Write Non-Volatile Memory Array Using a Magnetic Tunnel Junction and FET Switch in each Cell", 2000 IEEE ISSCC Digest of Technical Papers, TA7.2.

Generally, in the case of performing the storage of data in each memory cell used as a memory element in the nonvolatile memory device or MRAM device, data is written by applying a predetermined voltage and supplying a current to the memory cell. In this MRAM device, a predetermined data write current is supplied to the memory cell and a desired magnetic field based on the data write current is applied to the thin film magnetic element, thereby performing data write by which the magnetic direction of the thin film magnetic element changes.

However, various wirings used for various purposes including a wiring for supplying a data write current are arranged in the MRAM device, and a magnetic field is generated when a current is carried to each of these various wirings. In this case, magnetic field noise is often applied to unselected memory cells other than a selected memory cell.

Such magnetic field noise may possibly change the magnetic direction of the thin film magnetic elements of the unselected memory cells, depending on the magnetic field level of the noise. More specifically, data may be possibly erroneously written to the other unselected memory cells.

The typical example of such magnetic field noise is a magnetic field generated by currents carried to a power supply wiring and a ground wiring for supplying an operating voltage to peripheral circuits so as to perform data read and data write from and to the memory sections of the MRAM device. The currents carried to the power supply wiring and the ground wiring tend to peak during the operation of the peripheral circuits, so that the magnetic field noise from the wirings has a certain degree of intensity.

In the case where the power supply wiring and the like are arranged in the vicinity of the memory sections, i.e., in the vicinity of the tunneling magneto-resistance elements TMR or arranged on the memory sections for realizing high integration, in particular, it is necessary to take measures to prevent the lowering of an operation margin and erroneous data write caused by the magnetic field noise from the power supply wiring.

SUMMARY OF THE INVENTION

The present invention has been achieved to solve these disadvantages. It is an object of the present invention to provide a thin film magnetic memory device which stably operates by suppressing the influence of magnetic field noise from a power supply wiring and a ground wiring.

According to an aspect of the present invention, a thin film magnetic memory device includes: a plurality of memory regions, arranged in a column direction, each having a plurality of memory cells arranged in a matrix; and first and second pair of power supply lines. Each of the memory regions includes a plurality of bit lines, and first and second driver bands. The plurality of bit lines are provided in correspondence with memory cell columns, respectively. The first driver band is arranged in a first direction of the plurality of bit lines, and supplied with power for supplying a data write current to at least one bit line among the plurality of bit lines. The second driver band is arranged in a second direction opposite to the first direction of the plurality of bit lines, and supplied with the power for supplying the data write current to at least one bit line among the plurality of bit lines. The first pair of power supply line is arranged in the column direction, and supplies the power to the first driver band from the first direction. The second pair of power supply line is arranged in the column direction, and supplies the power to the second driver band from the second direction. Each of the first and second pair of power supply lines includes first and second power lines supplying a first voltage and a second voltage, respectively. When data is written, the first driver band corresponding to the selected memory region selected by an externally applied address designation among the plurality of memory regions is connected to one of the first and second power lines of the first pair of power supply line in accordance with written data, and the second driver band corresponding to the selected memory region is connected to the other one of the first and second power lines of the second pair of power supply line in accordance with the written data.

According to the present invention, as described above, the first power supply line supplied with the power from the first direction, the first driver band arranged in the first direction, the second power supply line supplied with the power from the second direction, and the second driver band arranged in the second direction are provided, the first driver band is connected to the first power supply line, and the second driver band is connected to the second power supply line. Therefore, the first driver band in the selected memory region is always supplied with power from the first direction (direction outside of the memory region), and the second driver band is always supplied with the power from the second direction (direction outside of the memory region). Therefore, in the region, no current path is formed on the first power supply line and the second power supply line. It is thereby possible to suppress magnetic field noise in the selected memory region and to prevent erroneous data writing.

According to another aspect of the present invention, a thin film magnetic memory device includes: a plurality of memory regions, arranged in a column direction, each having a plurality of memory cells arranged in a matrix; and first and second power supply lines. Each of the memory regions includes a plurality of bit lines, and first and second driver bands. The plurality of bit lines are provided in correspondence with memory cell columns, respectively. The first driver band is arranged in a first direction of the plurality of bit lines, and supplied with power for supplying a data write current to at least one bit line among the plurality of bit lines. The second driver band is arranged in a second direction opposite to the first direction of the plurality of bit lines, and supplied with the power for supplying the data write current to at least one bit line among the plurality of bit lines. The first power supply line is arranged in correspondence with the first driver band along the column direction, and supplies. a first voltage from the first direction. The second power supply line is arranged in correspondence with the second driver band along the column direction, and supplies a second voltage from the second direction. When data is written, one of the first and second driver bands corresponding to the selected memory region selected from the plurality of memory regions in accordance with written data is connected to one of the corresponding first and second power supply lines, and the other one of the corresponding first and second driver bands is electrically connected to the second voltage.

This thin film magnetic memory device includes: the first power supply line supplied with the power from the first direction; the first driver band arranged in the first direction; the second power supply line supplied with the first voltage from the second direction; and the second driver band arranged in the second direction. When data is written, one of the first and second driver bands is connected to one of the first and second power supply lines, while the other driver band is electrically coupled to the second voltage. Therefore, one of the first and second driver bands in the selected memory region is supplied with the first voltage from a predetermined one of the corresponding first and second directions (direction outside of the memory region). Therefore, in the selected memory region, no current path is formed on the first power supply line and the second power supply line. It is thereby possible to suppress magnetic field noise in the selected memory region and to prevent erroneous data writing.

According to still another aspect of the present invention, a thin film magnetic memory device includes: a plurality of memory regions, arranged in a row direction, each having a plurality of memory cells arranged in a matrix; and a first power supply line. Each of the memory regions includes a plurality of digit lines and a digit line driver band. The plurality of digit lines are provided in correspondence with memory cell rows, respectively. The digit line driver band is arranged in a first direction of the plurality of digit lines, and supplied with a first voltage for supplying a data write current to at least one digit line selected from the plurality of digit lines. The first direction and the second direction opposite to the first direction of each of the digit line is coupled to the second voltage. The first power supply line is electrically coupled to the digit line driver band in the row direction, and supplies: the first voltage from the first direction.

In this thin film magnetic memory device, the digit line driver band is provided in the first direction of the digit lines, and the second direction sides of the digit lines are electrically coupled to the second voltage. Further, the first power supply line supplying the first voltage from the first direction is provided, and connected to the digit line driver band. Therefore, in the selected memory region, the digit line driver band is always supplied with the first voltage from the first direction (direction outside of the memory region). Therefore, in the selected memory region, no current path is formed on the first power supply line. It is thereby possible to suppress magnetic field noise in the selected memory region and to prevent erroneous data writing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings. It is noted that same or corresponding constituent elements are respectively denoted by the same reference symbols and will not be repeatedly described.

First Embodiment

Figure 1:
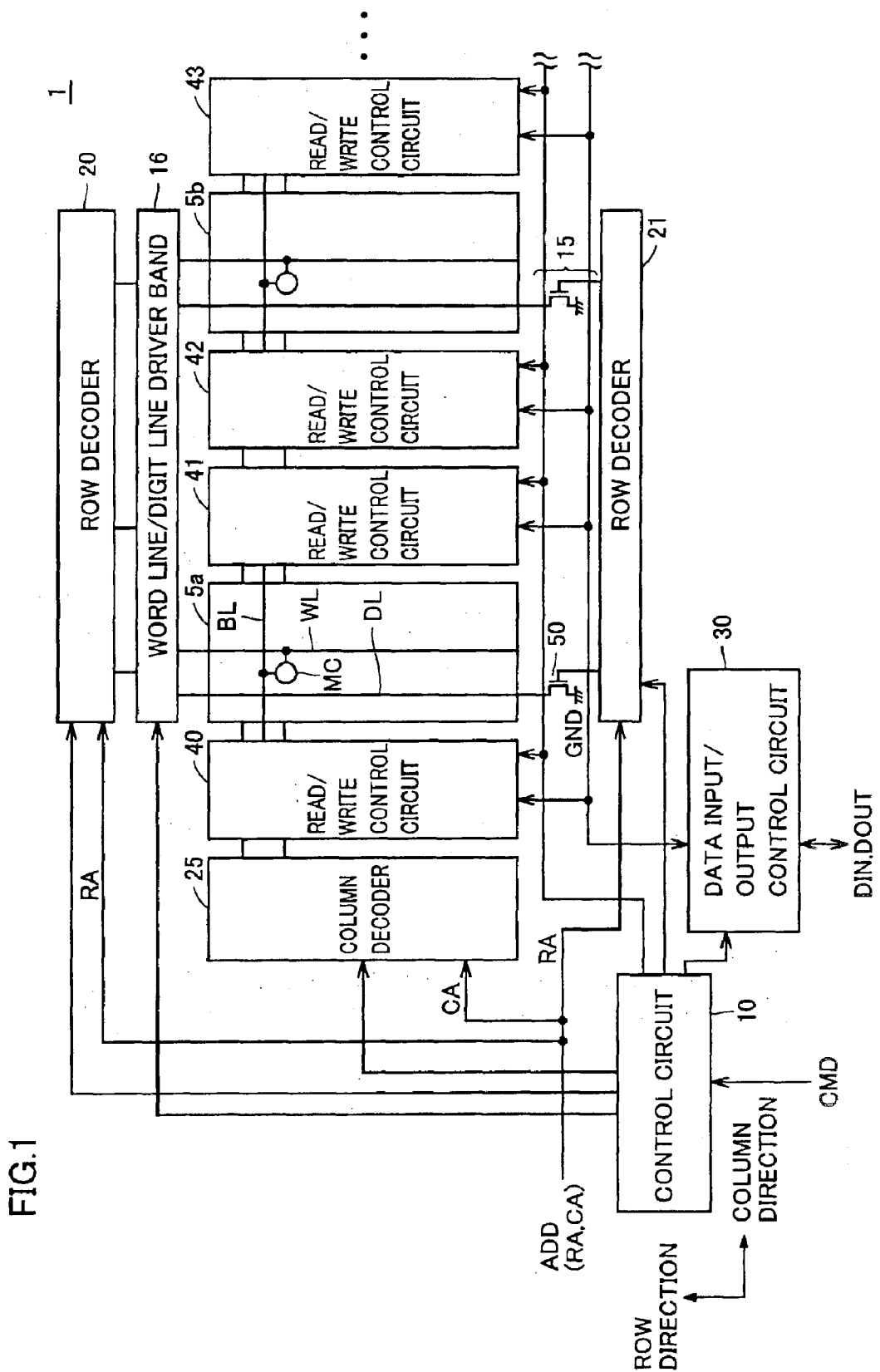
FIG. 1 is a schematic block diagram showing the overall configuration of an MRAM device according to a first embodiment of the present invention.

Referring to FIG. 1, an MRAM device 1 according to a first embodiment of the present invention perform random access in response to a control signal CMD and an address signal ADD applied from the outside of MRAM device 1 and, also, performs input of input data DIN and output of output data DOUT.

MRAM device 1 includes: a control circuit 10 for controlling the overall operation of MRAM device 1 in response to control signal CMD; and a plurality of memory blocks 5a, 5b each including MTJ memory cells MC arranged in a matrix. While FIG. 1 shows only two memory blocks 5a, 5b, the number of memory blocks is not limited to two but may be two or more. Memory blocks 5a, 5b will be also generically referred to as "memory blocks 5". In addition, the rows and columns of a plurality of memory cells MC arranged to be integrated in a matrix in each memory block 5 will be also referred to as "memory cell rows" and "memory cell columns", respectively.

MRAM device 1 also includes row decoders 20, 21, a column decoder 25 and a data input/output control circuit 30.

Each of row decoders 20, 21 performs row selection in access target memory block 5 on the basis of a row address RA in address signal ADD. Column decoder 25 performs column selection in access target memory block on the basis of a. column address CA in address signal ADD. Data input/output control circuit 30 controls the input and output of input data DIN and output data DOUT, and either transmits data to an internal circuit or outputs the data to the outside in response to an instruction from control circuit 10.

MRAM device 1 further includes read/write control circuits arranged on the both sides of each memory block 5, respectively. The read/write control circuit is a generic term of a circuit group arranged in a region adjacent to memory block 5 in order to carry a data write current and a data read current to a selected memory cell column (hereinafter, also referred to as "selected column"). In this embodiment, read/write control circuits 40, 41 provided in correspondence with memory block 5a and read/write control circuits 42 and 43 provided in correspondence with memory block 5b are shown.

Each memory block 5 includes a plurality of word lines WL and digit lines DL provided in correspondence with the respective memory cell rows and a plurality of bit lines BL provided in correspondence with the respective memory cell columns. In FIG. 1, one memory cell MC is typically shown in memory block 5a, and one word line WL and one digit line DL corresponding to the memory cell row of memory cell MC are typically shown. In addition, one bit line BL corresponding to the memory cell column of memory cell MC is typically shown. Since the configurations of other memory blocks 5 are equal to that of memory block 5a, they will not be repeatedly described herein.

MRAM device 1 further includes a word line/digit line driver band 16 for driving word line WL and digit line DL on the basis of the row select result of row decoder 20 and an instruction from control circuit 10.

In a switch region 15 on an opposite side to row decoder 20 across memory blocks 5, a plurality of transistors 50 are arranged in correspondence with the plurality of digit lines DL, respectively. In this embodiment, one transistor 50 corresponding to one digit line DL of memory block 5a is shown. Transistor 50 is arranged between corresponding digit line DL and a ground voltage GND, and the gate thereof receives the input of a row select result from row decoder 21.

Row decoder 21 selectively turns on at least one of the plurality of transistors 50 on the basis of row address RA inputted when data is written. Accordingly, select target digit line DL is electrically coupled to ground voltage GND in response to the on-state of transistor 50.

In this embodiment, description will be given of a configuration in which switch region 15 is provided to select one of the plurality of transistors 50 by row decoder 21. However, the configuration of the present invention is not limited thereto but may be such that switch region 15 and row decoder 21 are not provided. Specifically, the configuration may be such that one end of digit line DL is always electrically coupled to ground voltage GND.

In the following description, the binary states, i.e., the high voltage state and the low voltage state of signals, signal lines, data and the like will be referred to as "H" level and "L" level, respectively, in some cases.

Figure 2:
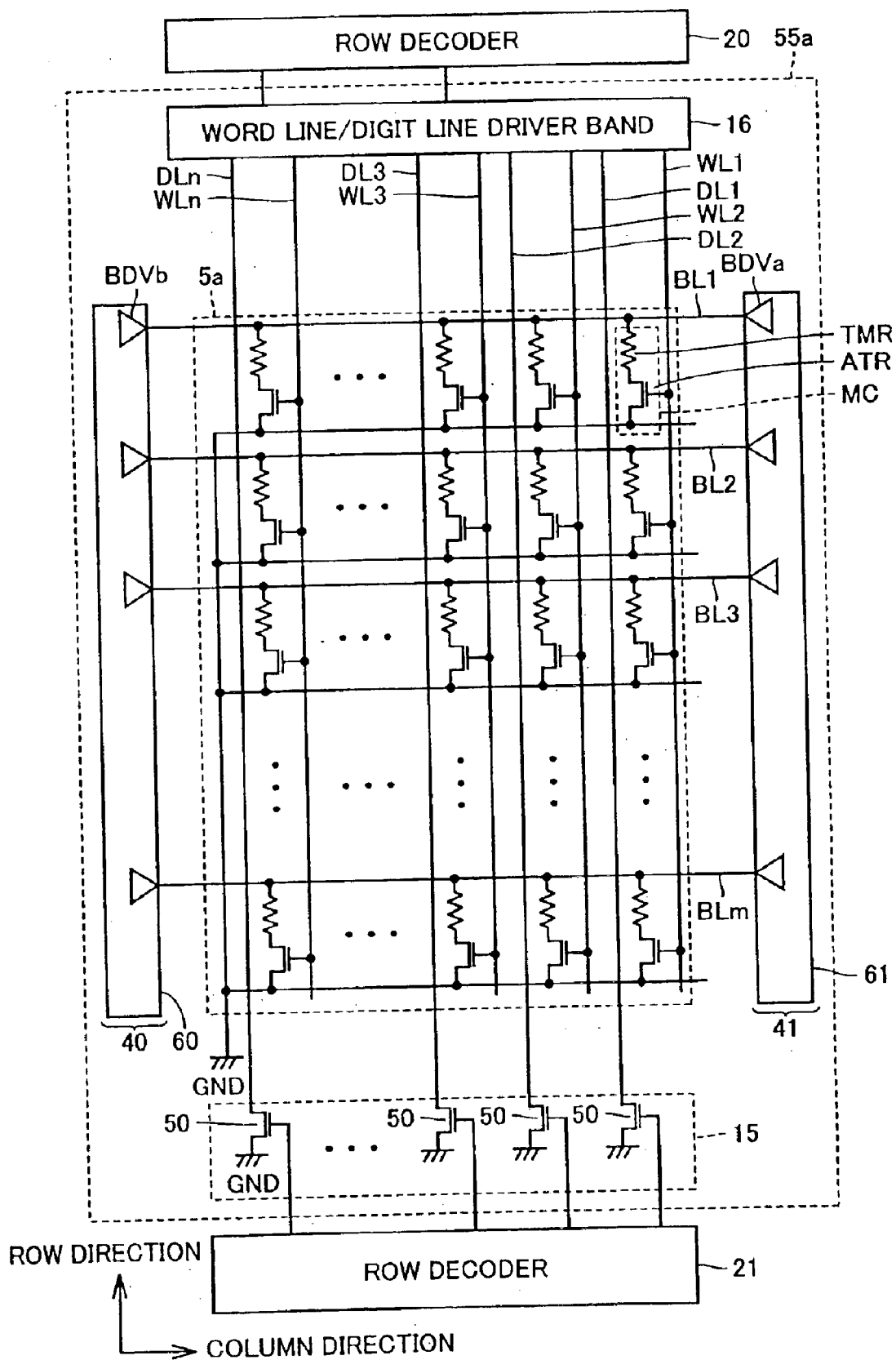
FIG. 2 is a schematic block diagram showing the circuit configuration of a memory block and peripheral circuits thereof.

Referring to FIG. 2, memory block 5a includes a plurality of MTJ memory cells MC arranged in n rows and m columns (where n and m are natural numbers). Word line WL, digit line DL and bit line BL are arranged for each MTJ memory cell MC. Word line WL and digit line DL are arranged in correspondence with each memory cell row in a row direction. Bit line BL is arranged in correspondence with each memory cell column in a column direction. As a result, in overall memory block 5a, word lines WL1 to WLn, digit lines DL1 to DLn and bit lines BL1 to BLm are arranged.

Memory cell MC includes a tunneling magneto-resistance element TMR and an access transistor ATR connected in series to tunneling magneto-resistance element TMR. Access transistor ATR electrically couples tunneling magneto-resistance element TMR to ground voltage in response to the activation of corresponding word line WL. In the following, when the word lines, digit lines and bit lines are expressed generically, they will be denoted by reference symbols WL, DL and BL, respectively.

As described above, word line/digit line driver band 16 selectively activates word line WL (when data is read) or digit line DL (when data is written) on the basis of the row select result based on row address RA inputted to row decoder 20.

Read/write control circuit 41 includes a driver band 61 having a plurality of drivers BDVa each of which is provided on one end of each bit line BL, receives power supply, and supplies a data write current in order to generate a predetermined magnetic field. Read/write control circuit 40 includes a driver band 60 having a plurality of drivers BDVb each of which is provided on the other end of each bit line BL, receives power supply, and supplies the data write current in order to generate the predetermined magnetic field.

Data writing using tunneling magneto-resistance element TMR will not be described herein.

Figure 3:
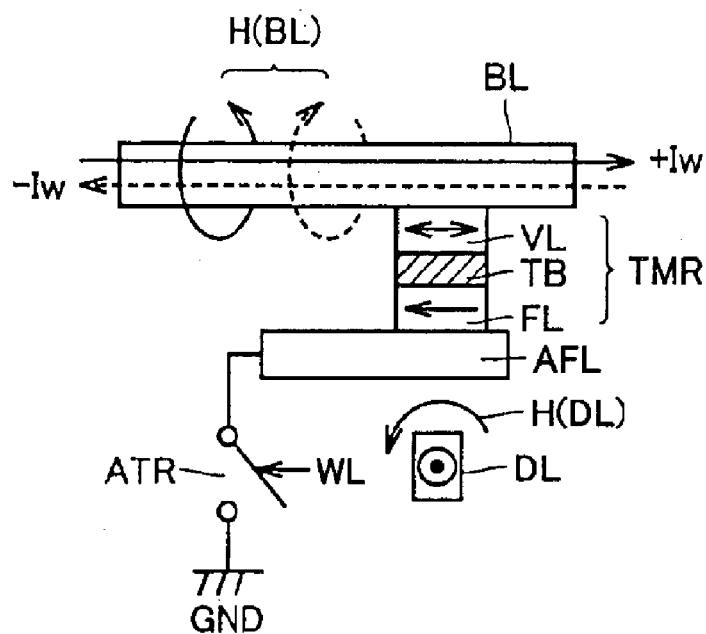
FIG. 3 is a conceptual diagram for describing a data write operation for a tunneling magneto-resistance element.

Referring to FIG. 3, tunneling magneto-resistance element TMR includes: a ferromagnetic material layer FL having a fixed, certain magnetic direction (hereinafter, also referred to as "fixed magnetic layer"); and a ferromagnetic material layer VL magnetized in a direction according to an externally applied magnetic field (hereinafter, also referred to as "free magnetic layer"). A tunneling barrier (tunneling film) TB made of an insulation film is provided between fixed magnetic layer FL and free magnetic layer VL. Free magnetic layer VL is magnetized in an equal or opposite direction to that of fixed magnetic layer FL in accordance with the level of storage data to be written. Fixed magnetic layer FL, tunneling barrier TB and free magnetic layer VL form a magnetic tunnel junction.

The electric resistance of tunneling magneto-resistance element TMR changes according to the relative relationship between the magnetic direction of fixed magnetic layer and that of free magnetic layer VL. Specifically, the electric resistance of tunneling magneto-resistance element TMR has a minimum value Rmin when the magnetic direction of fixed magnetic layer FL is equal (parallel) to that of free magnetic layer VL, and has a maximum value Rmax when the magnetic direction of fixed magnetic layer FL is opposite (nonparallel) to that of free magnetic layer VL.

When data is written, data write currents for magnetizing free magnetic layer VL are carried to bit line BL and digit line DL in a direction according to the level of written data, respectively. A data write current ±Iw is carried to bit line BL in accordance with the level of written data. A magnetic field H(BL) is thereby generated. In addition, a magnetic field H(DL) is generated by the data write current carried to digit line DL.

Figure 4:
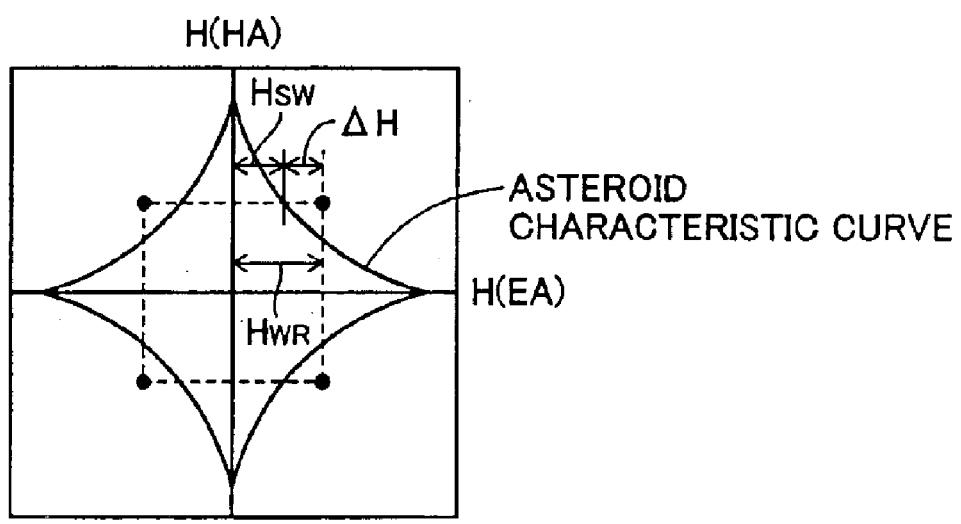
FIG. 4 is a conceptual diagram showing the relationship between a data write current and the magnetic direction of the tunneling magneto-resistance element when data is written.

Referring to FIG. 4, description will be given of the relationship between the data write currents and the magnetic direction of tunneling magneto-resistance element TMR when data is written.

The horizontal axis H(EA) represents a magnetic field applied to free magnetic layer VL in tunneling magneto-resistance element TMR in an easy axis (EA). The vertical axis H(HA) represents a magnetic field applied to free magnetic layer VL in a hard axis (HA). Magnetic fields H(EA) and H(HA) correspond to two magnetic fields H(BL) and H(DL) generated by the currents carried to bit line BL and digit line DL, respectively.

In tunneling magneto-resistance element TMR, the fixed magnetic direction of fixed magnetic layer FL is along the easy axis of free magnetic layer VL, and free magnetic layer VL is magnetized in a parallel or nonparallel (opposite) direction to that of fixed magnetic layer FL along the easy axis in accordance with the level ("1" or "0") of the storage data. Tunneling magneto-resistance element TMR can store one-bit data ("1" and "0") in correspondence with the two magnetic directions of free magnetic layer VL, respectively.

The magnetic direction of free magnetic layer VL can be newly rewritten only in the case where the sum of magnetic field H(EA) and H(HA) to be applied reaches a region outside of an asteroid characteristic curve shown in FIG. 4. More specifically, when the applied data write magnetic field has intensity corresponding to the inside region of the asteroid characteristic curve, the magnetic direction of free magnetic layer VL has no change.

As indicated by the asteroid characteristic curve, it is possible to lower a magnetic threshold necessary to change the magnetic direction along the easy axis by applying a magnetic filed in the hard axis to free magnetic layer VL. In the case where operation points when the data is written are designed as in the example of FIG. 4, the data write magnetic field in the easy axis direction is designed to have an intensity $H_{WR}$ in data write target tunneling magneto-resistance element TMR. That is, the value of the data write current carried to either bit line BL or digit line DL is designed so as to obtain data write magnetic field $H_{WR}$. Generally, data write magnetic field $H_{WR}$ is given by the sum of a switching magnetic field $H_{sw}$ necessary to switching of the magnetic direction and a margin $\Delta H$. In other words, data write magnetic field $H_{WR}$ is given by the formula: $H_{WR} = H_{SW} + \Delta H$.

In order to rewrite the storage data of memory cell MC, i.e., the magnetic direction of tunneling magneto-resistance element TMR, it is necessary to carry data write currents equal to or more than predetermined level to digit line DL and bit line BL, respectively. With this arrangement, free magnetic layer VL in tunneling magneto-resistance element TMR is magnetized in a parallel or opposite (nonparallel) to the direction of fixed magnetic layer FL in accordance with the direction of the data write magnetic field along the easy axis (EA). The magnetic direction which has been written to tunneling magneto-resistance element TMR, i.e., the storage data of memory cell MC is maintained in a nonvolatile manner until new data is written.

As will become obvious from the following description, the present invention is directed to the arrangement of a power supply wiring and ground wiring for supplying power in order to supply the data write currents when data is written. In the present specification, a power supply voltage VCC and a ground voltage GND will be also generically referred to as "power supplies". In addition, the power supply wiring supplying power supply voltage VCC and the ground wiring supplying ground voltage GND will be also generically referred to as "power supply lines".

Figure 5:
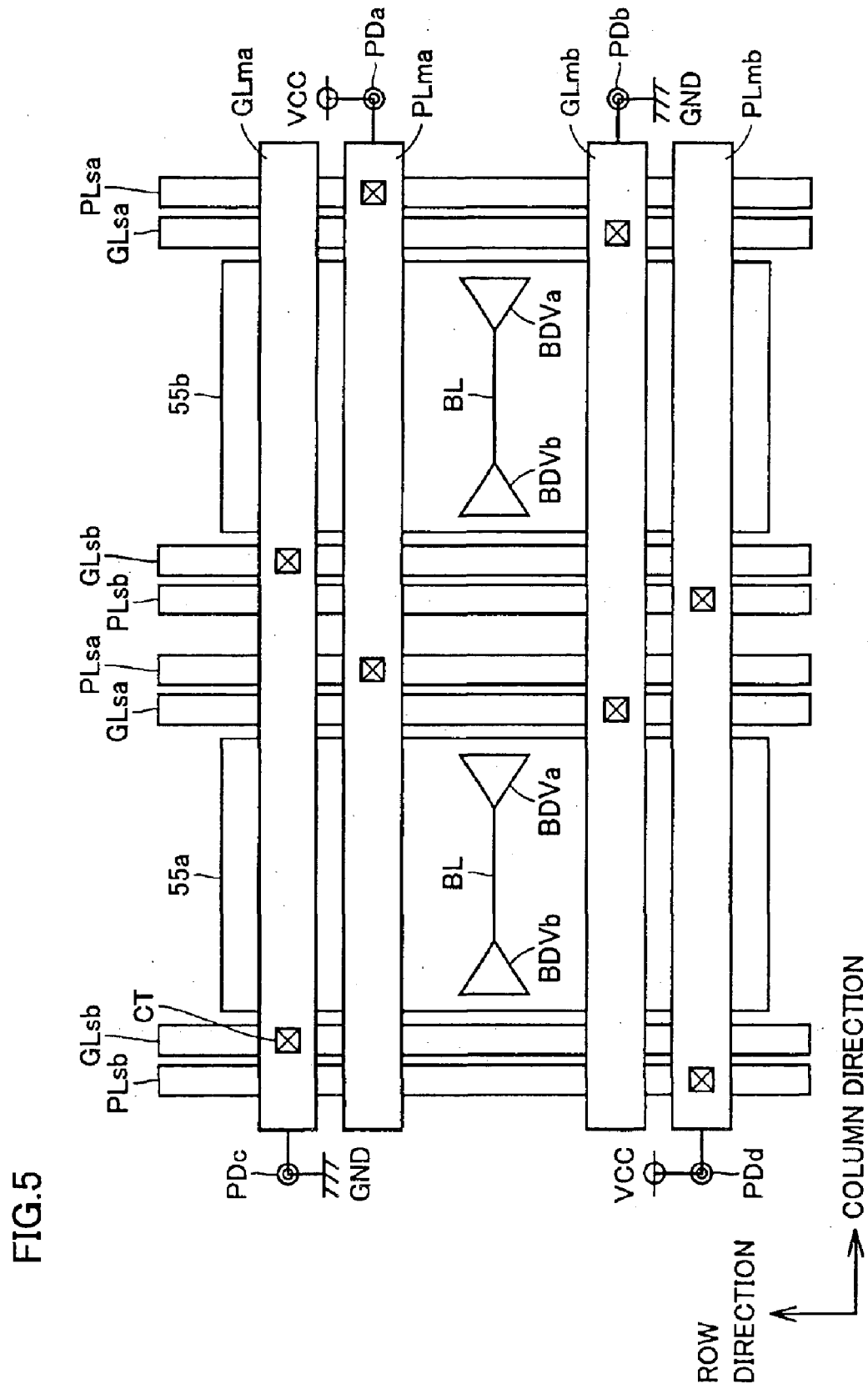
FIG. 5 is a conceptual diagram for describing the arrangement of power supply lines which supply power to a bit line driver in order to supply the data write current.

Referring to FIG. 5, description will be given of the arrangement of the power supply lines supplying power to bit line drivers BDVa and BDVb for supplying the data write currents.

The arrangement thereof will be described in relation to a memory region 55a which includes memory block 5a and read/write control circuits 40 and 41 provided in correspondence with the both sides of memory blocks 5a, respectively. This is true for memory block 5b, and the arrangement will be described in relation to a memory region 55b which includes memory block 5b and read/write control circuits 42 and 43.

A sub-power supply line PLsa and a sub-ground wiring GLsa receiving the supply of power supply voltage VCC and ground voltage GND, respectively, are arranged in the row direction in correspondence with one side of memory region 55a. A sub-power supply line PLsb and a sub-ground ground wiring GLsb receiving the supply of power supply voltage VCC and ground voltage GND, respectively, are arranged in the row direction in correspondence with the other side of memory region 55a. In the following, sub-power supply wirings PLsa and PLsb will be also generically referred as "sub-power supply wirings PLs". In addition sub-ground wiring GLsa and GLsb will be also generically referred to as "sub-ground wirings GLs". In memory region 55b, the sub-power supply wirings and the sub-ground wirings are arranged similarly to the arrangement described in relation to memory region 55a.

Further, main power supply wirings and main ground wirings are arranged in the column direction so as to supply power supply voltage VCC and ground voltage GND to sub-power supply wirings PLs and sub-ground wirings GLs, respectively.

In the arrangement according to the first embodiment of the present invention, a main power supply wiring PLma and a main ground wiring GLmb that are provided to supply power from one side (first direction) of each of memory regions 55a and 55b, and a main power supply wiring PLmb and a main ground wiring GLma that are provided to supply power from the other side (second direction opposite to the first direction) of each of memory regions 55a and 55b are arranged in the column direction. Main power supply wiring PLma and main ground wiring GLmb form a power supply line. Main power supply wiring PLmb and main ground wiring GLma form a power supply line. In this embodiment, main power supply wiring PLma is supplied with power supply voltage VCC from an external terminal PDa. Main power supply wiring PLmb is supplied with power supply voltage VCC from an external terminal PDd. Main ground wiring GLma is supplied with ground voltage GND from an external terminal PDc. Main ground wiring GLmb is supplied with ground voltage GND from an external terminal PDb.

Main power supply wiring PLma and main ground wiring GLmb that form a power supply line are electrically connected to sub-power supply wiring PLsa and sub-ground wiring GLsa that are arranged on one side of each of memory regions 55a and 55b through contact holes CT, respectively. In addition, main power supply wiring PLmb and main ground wiring GLmb that form a power supply line are electrically connected to sub-power supply wiring PLsb and sub-ground wiring GLsb that are arranged on the side of each of memory regions 55a and 55b through contact holes CT, respectively.

Figure 6:
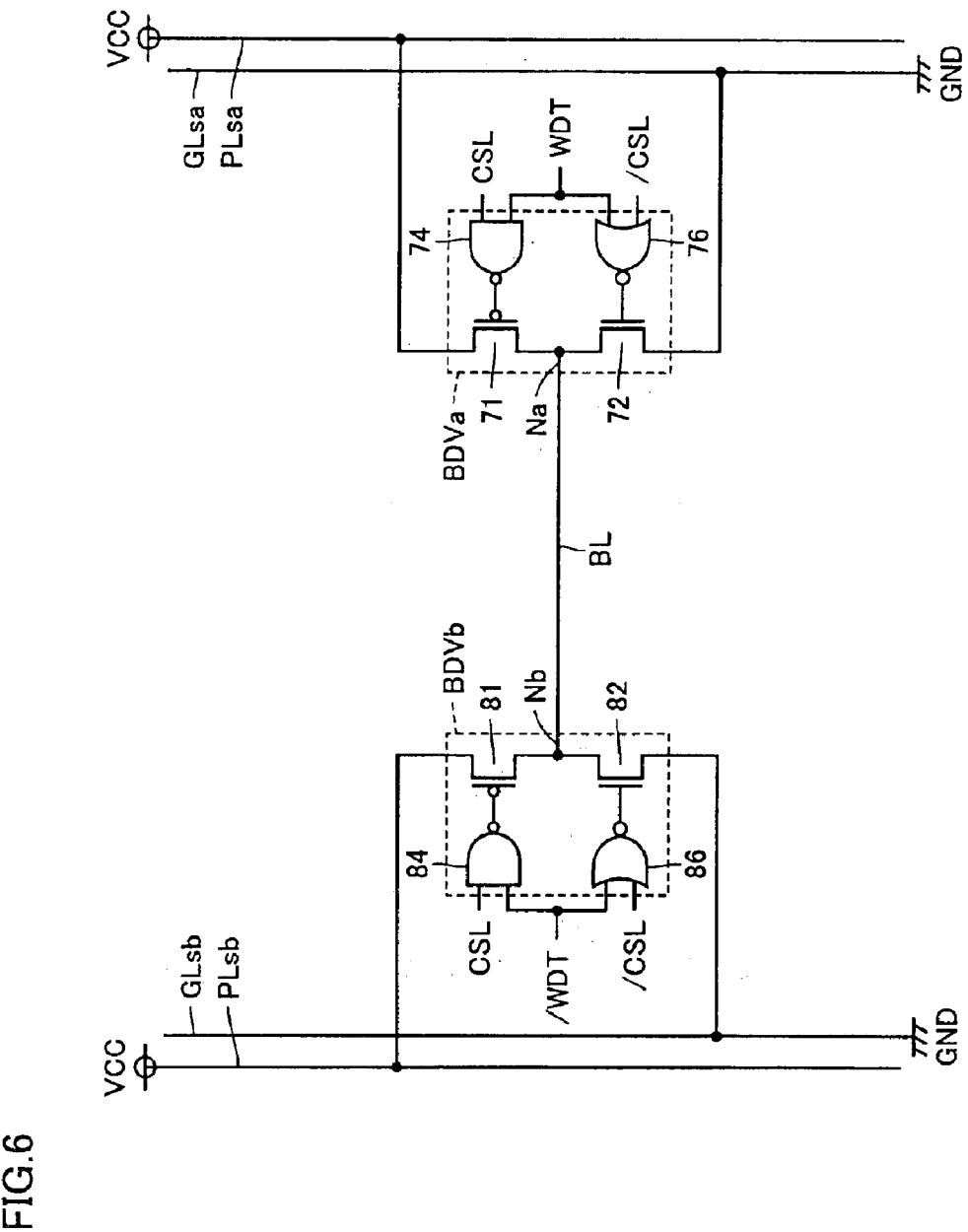
FIG. 6 is a circuit diagram showing the configuration of the bit line drivers shown in FIG. 5.

Referring to FIG. 6, bit line driver BDVa shown in FIG. 5 includes: a P-channel MOS transistor 71 electrically coupled between a node Na corresponding to one side of bit line BL and sub-power supply wiring PLsa; an N-channel MOS transistor 72 electrically coupled between node Na and sub-ground wiring GLsa; a logic gate 74 outputting a NAND logic operation result between a logic level of a corresponding column select line CSL and write data WDT; and a logic gate 76 outputting a NOR operation result between write data WDT and the inverted level /CSL of the corresponding column select line. The output of logic gate 74 is inputted to the gate of transistor 71, and that of logic gate 76 is inputted to the gate of transistor 72.

Column select line CSL is activated to "H" level when a corresponding memory cell column is selected by column decoder 25, and otherwise deactivated to "L" level. Write data WDT and IWDT are assumed to be generated on the basis of input data DIN of data input/output control circuit 30. For example, when input data DIN is "0", write data WDT and /WDT are set at "L" and "H" levels, respectively. When input data DIN is "1", write data WDT and /WDT are set at "H" and "L" levels, respectively.

Bit line driver BDVb includes: a P-channel MOS transistor 81 electrically coupled between a node Nb corresponding to the other side of bit line BL and sub-power supply wiring PLsb; an N-channel MOS transistor 82 electrically coupled between node Nb and sub-ground wiring GLsb; a logic gate 84 outputting a NAND logic operation result between a logic level of corresponding column select line CSL and inverted write data /WDT; and a logic gate 86 outputting a NOR logic operation result between inverted write data /WDT and the inverted level /CSL of the corresponding column select line. The output of logic gate 84 is inputted to the gate of transistor 81, and that of logic gate 86 is inputted to the gate of transistor 82.

Therefore, in the selected column (column select line CSL="H" level), bit line drivers BDVa and BDVb are activated. In accordance with the level of write data WDT, activated bit line driver BDVa selectively connects one of sub-power supply wiring PLsa and sub-ground wiring GLsa to node Na and activated bit line driver BDVb selectively connects one of sub-power supply wiring PLsb and sub-ground wiring GLsb to node Nb. When write data WDT is at "H" level, the data write current is carried in a direction from bit line driver BDVa to bit line driver BDVb. When write data WDT is at "L" level, the data write current is carried in a direction from bit line driver BDVb to bit line driver BDVa.

In each unselected column (column select line CSL="L" level), bit line driver BDVa is deactivated and not connected to either sub-power supply wiring PLsa or sub-ground wiring GLsa, and bit line driver BDVb is. deactivated and not connected to either sub-power supply wiring PLsb or sub-ground wiring GLsb. Therefore, no data write current is carried.

Figure 7:
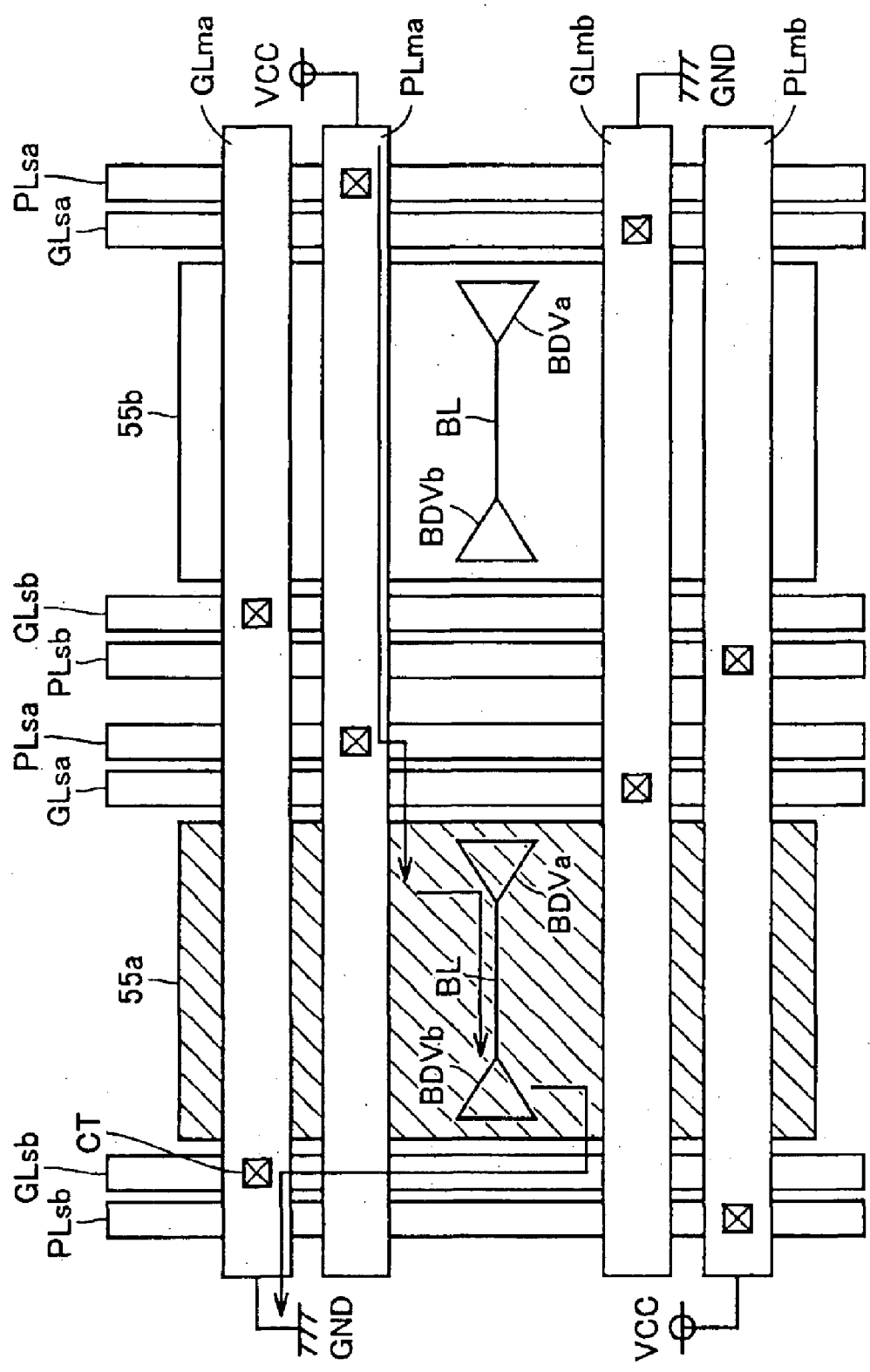
FIG. 7 illustrates one example of the flow of the data write current across the power supply line when a bit line in a memory region shown in FIG. 5 is selected.

Referring to FIG. 7, description will be given of the data write currents carried to the power supply lines when bit line BL in memory region 55a shown in FIG. 5 is selected.

By way of example, description will be given of the case where write data WDT and /WDT are set at "H" and "L" levels, respectively.

Sub-power supply wiring PLsa connected to bit line driver BDVa receives supply of power supply voltage VCC from main power supply wiring PLma through contact hole CT. Sub-ground wiring GLsb connected to bit line driver BDVb receives supply of ground voltage GND from main ground wiring GLma through contact hole CT.

Accordingly, the data write current according to the written data is carried from bit line driver BDVa to bit line driver BDVb. In this case, sub-power supply wiring PLsa is connected to main power supply wiring PLma supplied with power from one side and sub-ground wiring GLsb is connected to main ground wiring GLma supplied with power from the other side. Therefore, no data write current is carried to regions the main power supply wirings and the main ground wirings which regions intersect with selected memory region 55a as shown in FIG. 7.

Since the data write current passing through the power supply lines does not flow in selected memory region 55a, accompanying magnetic field noise generated does not influence memory region 55a. Accordingly, it is possible to suppress the erroneous write of data to unselected memory cells caused by the generation of the magnetic field noise thanks to the configuration of the present invention.

Figure 8:
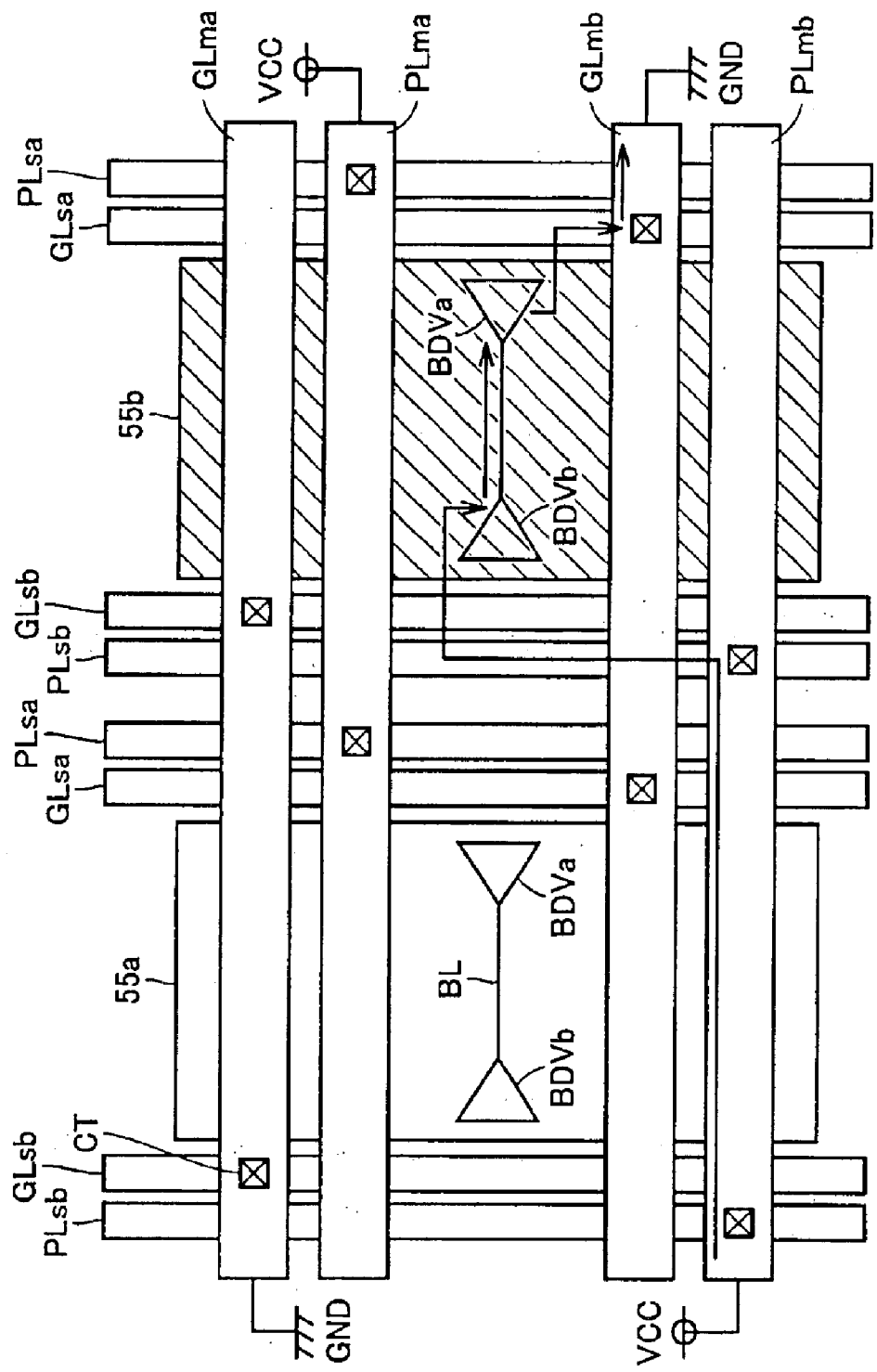
FIG. 8 illustrates another example of the flow of the data write current across the power supply line when a bit line in the other memory region is selected.

Referring to FIG. 8, description will be given of the data write currents carried to the power supply lines when bit line BL in other memory region 55b is selected.

By way of example, description will be given the case where write data WDT and /WDT are set at "L" and "H" levels, respectively.

Sub-power supply wiring PLsb connected to bit line driver BDVb receives supply of power supply voltage VCC from main power supply wiring PLmb through contact hole CT. Sub-ground wiring GLsa connected to bit line driver BDVa receives supply of ground voltage GND from main ground wiring GLmb through contact hole CT.

Accordingly, the data write current according to the written data is carried from bit line driver BDVb to bit line driver BDVa. In this case, sub-power supply wiring PLsb is connected to main power supply wiring PLmb supplied with power from on the other side and sub-ground wiring GLsa is connected to main ground wiring GLmb supplied with power from one side. Therefore, no data write current is carried to regions of the main power supply wirings and the main ground wirings which regions intersect with selected memory region 55b as shown in FIG. 8.

Therefore, it is possible to prevent erroneous write of data to unselected memory cells in memory region 55b when memory region 55b is selected.

In this embodiment, the configuration in which power is supplied to external terminals PDa to PDd has been described. Alternatively, power may be supplied thereto through buffer circuits or voltage control circuits.

Further, in this embodiment, the arrangement in which the power supply lines intersect one another on the memory region, i.e., in an upper layer region has been described. The present invention is not limited thereto but can be similarly applied to the arrangement of the power supply lines in or in the vicinity of the lower layer region of the memory region.

Moreover, since the current path of the data write currents is uniform irrespective of the selected memory region, it is possible to suppress the irregularity of the data write currents and to supply highly accurate data write currents.

First Modification of First Embodiment

In a modification of the first embodiment, description will be given of the arrangement of the power supply lines when each of the memory regions described with reference to FIG. 5 is divided into a plurality of block regions in the row direction. It is assumed herein that each block region includes at least one of a plurality of block units obtained by dividing each memory block in the row direction.

Figure 9:
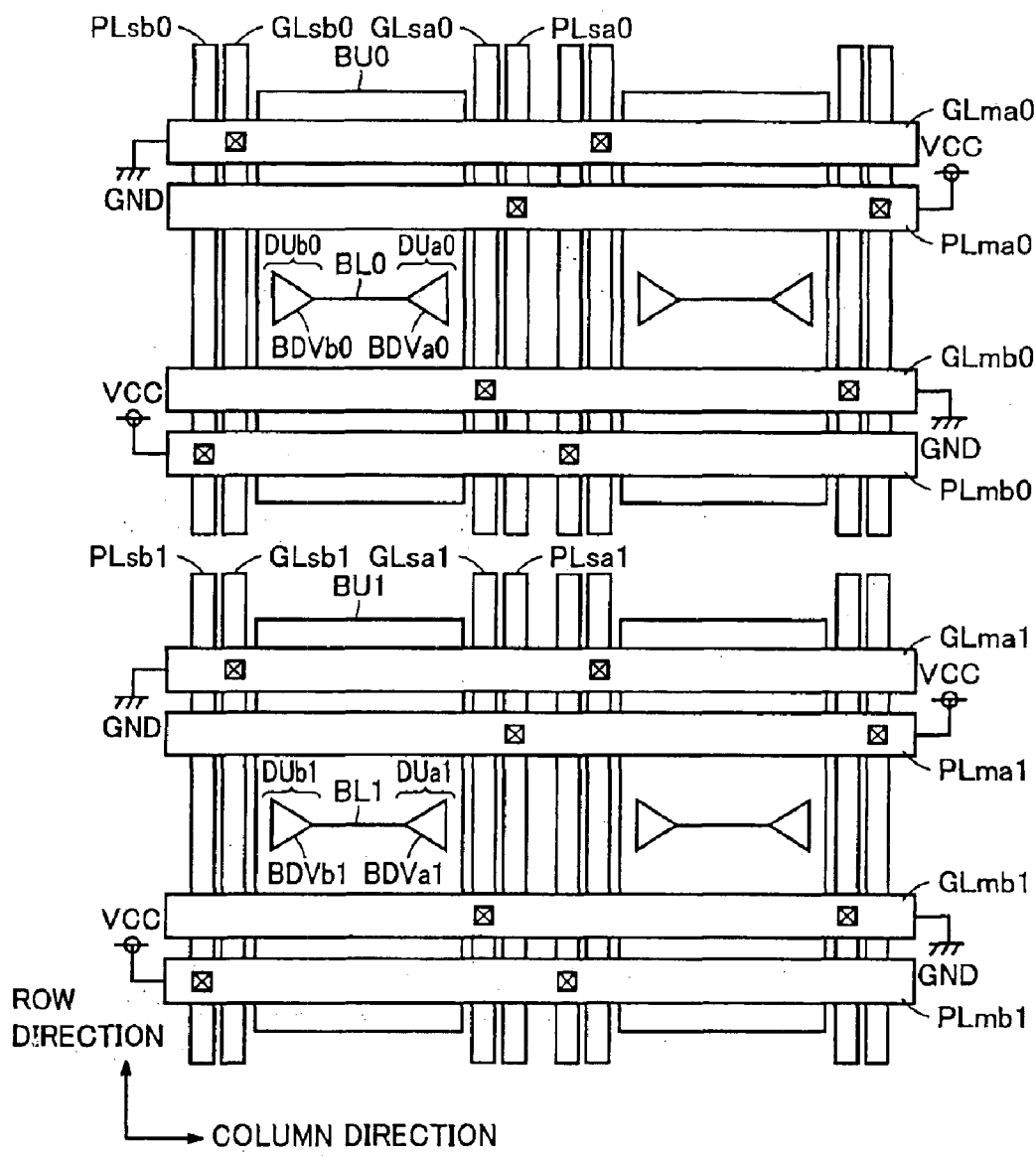
FIG. 9 is a conceptual diagram showing the arrangement of power supply wirings according to a first modification of the first embodiment.

Referring to FIG. 9, each of memory regions 55a and 55b is divided into a plurality of block regions BU in the row direction. Description will be given while mainly paying attention to memory region 55a.

By way of example, memory region 55a is divided into block regions BU0 and BU1. Sub-power supply wiring PLsa provided on one side of memory region 55a as described with reference to FIG. 5 is divided into sub-power supply wirings PLsa0 and PLsa1 in correspondence with respective block regions BU0 and BU1. Sub-ground wiring GLsa is divided into sub-ground wirings GLsa0 and GLsa1 in correspondence with respective block regions BU0 and BU1.

Sub-power supply wiring PLsb provided on the other side of memory region 55a is divided into sub-power supply wirings PLsb0 and PLsb1 in correspondence with respective block regions BU0 and BU1. Sub-ground wiring GLsb is divided into sub-ground wirings GLsb0 and GLsb1 in correspondence with respective block regions BU0 and BU1.

A bit line driver band 61 is also divided according to the respective block regions. In this embodiment, bit line driver band 61 is divided into driver units DUao and DUa1 in correspondence with one side of block region BU0 and that of block region BU1, respectively. A bit line driver band 60 is divided according to the respective block regions. In this embodiment, bit line driver band 60 is divided into driver units DUb0 and DUb1 in correspondence with the other side of block region BU0 and that of block region BU1, respectively.

Further, main power supply wirings and main ground wirings common to a plurality of block regions arranged in the column direction are provided. Specifically, main power supply wiring PLma0 and main ground wiring GLmb0 that supply power supply voltage VCC and ground voltage GND from one side, respectively, are provided in correspondence with the plurality of block regions including block region BU0 and arranged in the column direction. Main power supply wiring PLmb0 and main ground wiring GLma0 that supply power supply voltage VCC and ground voltage GND from the other side, respectively, are provided in correspondence with the plurality of block regions including block region BU0 and arranged in the column direction.

Likewise, main power supply wirings and main ground wirings are arranged in correspondence with a plurality of block regions including block region BU1 and arranged in the column direction. Specifically, main power supply wiring PLma1 and main ground wiring GLmb1 that supply power supply voltage VCC and ground voltage GND from one side, respectively, are provided and main power supply wiring PLmb1 and main ground wiring GLma1 that supply power supply voltage VCC and ground voltage GND from the other side, respectively, are provided in correspondence with the plurality of block regions including block region BU1 and arranged in the column direction.

Further, FIG. 9 typically shows bit line BL0, bit line driver BDVa0 provided in correspondence with one side of bit line BL0, and bit line driver BDVb0 provided in correspondence with the other side of bit line BL0 in block region BU0. Likewise, FIG. 9 typically shows bit line BL1, bit line driver BDVa1 provided in correspondence with one side of bit line BL1, and bit line driver BDVb1 provided in correspondence with the other side of bit line BL1 in block region BU1.

Hereinafter, description will be given of a configuration for performing data write parallel to the divided block regions.

By way of example, data input/output control circuit 30 outputs one-bit write data WDT to each of block regions BU in. parallel on the basis of the input of input data DIN of a plurality of bits.

Figure 10:
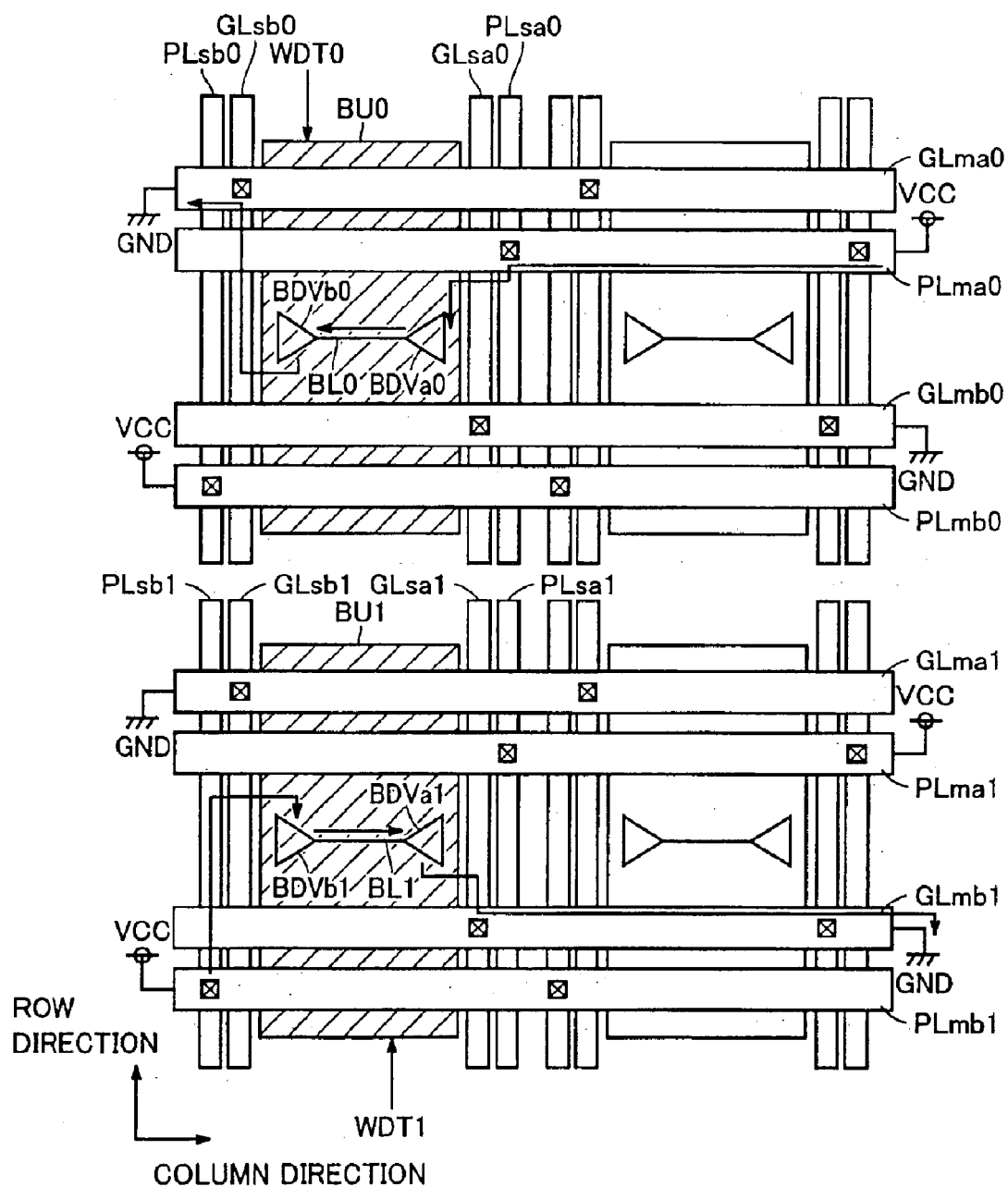
FIG. 10 illustrates one example for describing operation when parallel data writing is performed to divided blocks described with reference to FIG. 9.

Referring to FIG. 10, description will be given of an operation for performing data write parallel to divided block regions BU0 and BU1 as described with reference to FIG. 9.

By way of example, data input/output control circuit 30 generates write data WDT0 (at "H" level) for the bit line drivers in block region BU0 and written WDT1 (at "L" level) for the bit line drivers in block region BU1 on the basis of input data DIN.

In accordance with write data WDT0 (at "H" level), a data write current is carried in a direction from bit line driver BDVa0 to bit line driver BDVb0 in block region BU0. In accordance with write data WDT1 (at "L" level), a data write current is carried in a direction from bit line driver BDVb1 to bit line driver BDVa1 in block region BU1.

In this case, the data write currents are supplied to respective bit lines BL0 and BL1 in accordance with the same method as that described with reference to FIGS. 7 and 8. More specifically, bit line driver BDVa0 is connected to main power supply wiring PLma0 receiving the supply of power supply voltage VCC from one side, whereas bit line driver BDVb0 is connected to main ground wiring GLma0 receiving the supply of ground voltage GND from the other side. Therefore, no data write current is carried to the power supply lines in selected block region BU0, making it possible to prevent erroneous write of data caused by the magnetic. field noise while writing data in block region BU0.

Further, bit line driver BDVb1 is connected to main power supply wiring PLmb1 receiving the supply of power supply voltage VCC from the other side, whereas bit line driver BDVa1 is connected to main ground wiring GLmb1 receiving the supply of ground voltage GND from one side. Therefore, no data write current is carried to the power supply lines in selected block region BU1, making it possible to prevent erroneous write of data caused by the magnetic field noise while writing data in block region BU1.

It is therefore possible to prevent the magnetic field noise in the configuration in which data writing is performed in parallel to a plurality of block regions and to stably perform data writing.

Second Modification of First Embodiment

In a second modification of the first embodiment, description will be given of the arrangement of the power supply lines when memory regions 55a and 55b arranged in the column direction as described with reference to FIG. 5 in the first embodiment form one bank and a plurality of banks are arranged in MRAM device 1.

Figure 11:
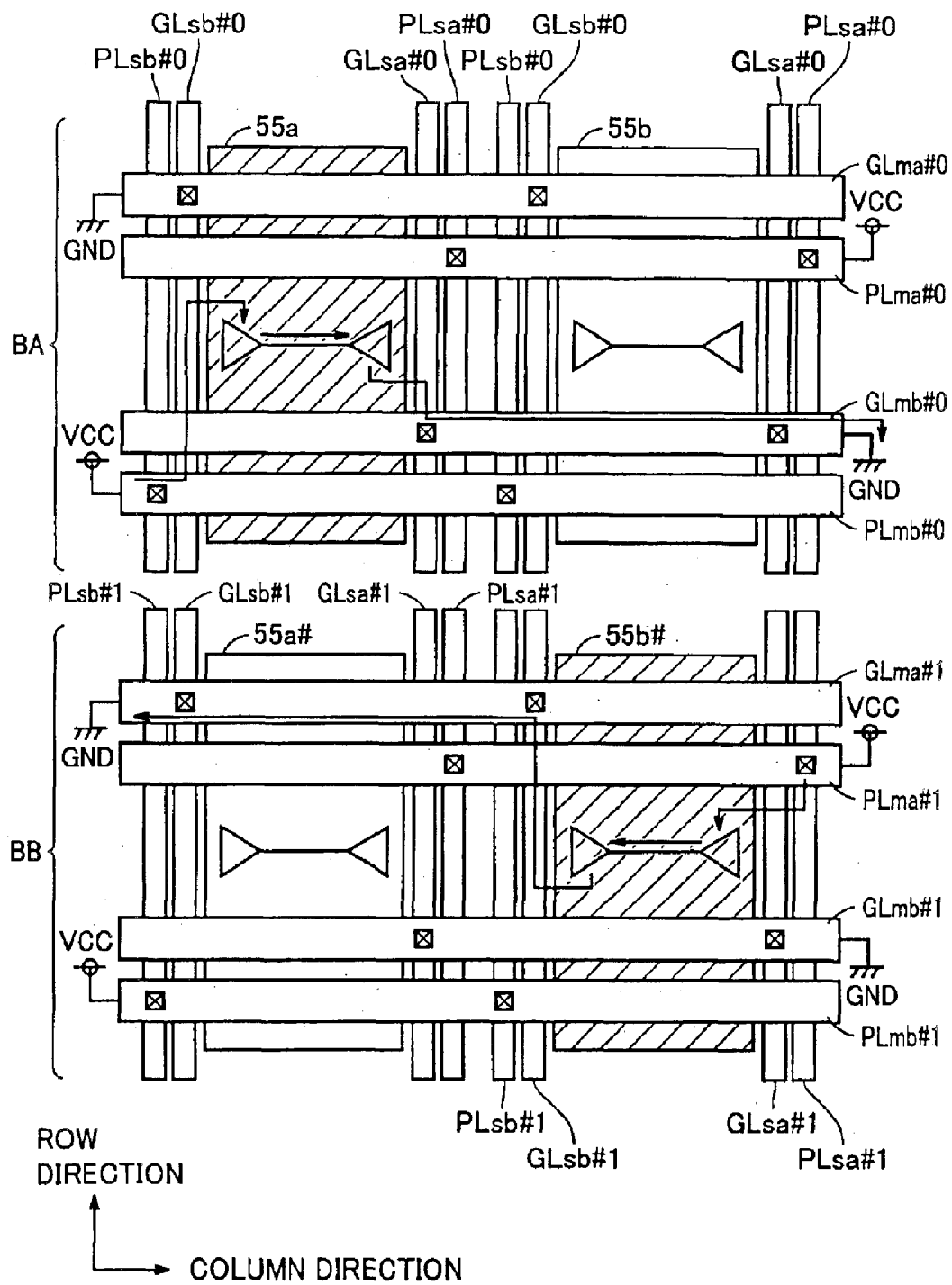
FIG. 11 is a conceptual diagram showing parallel data writing performed in a configuration of a plurality of banks according to a second modification of the first embodiment.

Referring to FIG. 11, description will be given of the case of performing parallel data writing in the configuration of including a plurality of banks according to the second modification of the first embodiment.

Memory regions 55a and 55b arranged in the column direction form a bank BA. Memory regions 55a# and 55b# arranged in the column direction form a bank BB. Since memory regions 55a# and 55b# are equal in configuration to memory regions 55a and 55b described above, they will not be repeatedly described herein.

It is also assumed that the configuration of the second modification of the first embodiment, similarly to a configuration in which row decoders 20 and 21 are provided in correspondence with bank BA, though not shown, is such that circuits corresponding to row decoders 20 and 21 are provided in correspondence with bank BB.

With the configuration of the second modification of the first embodiment according to the present invention, the sub-power supply/ground wirings and main power supply/ground wirings are arranged in each bank similarly to the configuration described in the first embodiment. Specifically, a sub-power supply wiring PLsa#0 and a sub-ground ground wiring GLsa#0 are arranged in correspondence with one side of each of memory regions 55a and 55b in bank BA. A sub-power supply wiring PLsb#0 and a sub-ground wiring GLsb#0 are arranged in correspondence with the other side thereof. In addition, main power supply wirings PLma#0 and Plmb#0 and main ground wirings GLma#0 and GLmb#0 provided to be common to bank BA are arranged in the same manner as that described in the first embodiment. Specifically, main power supply wiring PLma#0 supplying power supply voltage VCC from one side is electrically coupled to sub-power supply wiring PLsa#0. Main power supply wiring PLmb#0 supplying power supply voltage VCC from the other side is electrically coupled to sub-power supply wiring PLsb#0. Main ground wiring GLma#0 supplying ground voltage GND from the other side is electrically coupled to sub-ground wiring GLsb#0. Main ground wiring GLmb#0 supplying ground voltage GND from one side is electrically coupled to sub-ground wiring GLsa#0.

Further, a sub-power supply wiring PLsa#1 and a sub-ground wiring GLsa#1 are arranged in correspondence with one side of each of memory regions 55a# and 55b# in bank BB. A sub-power supply wiring PLsb#1 and a sub-ground wiring GLsb#1 are arranged in correspondence with the other side thereof. In addition, main power supply wirings PLma#1, Plmb#1 and main ground wirings GLma#1, GLmb#1 provided to be common to bank BB are arranged in the same manner as that for bank BA. Specifically, main power supply wiring PLma#1 supplying power supply voltage VCC from one side is electrically coupled to sub-power supply wiring PLsa#1. Main power supply wiring PLmb#1 supplying power supply voltage VCC from the other side is electrically coupled to sub-power supply wiring PLsb#1. Main ground wiring GLma#1 supplying ground voltage GND from the other side is electrically coupled to sub-ground wiring GLsb#1. Main ground wiring GLmb#1 supplying ground voltage GND from one side is electrically coupled to sub-ground wiring GLsa#1.

In this modification, parallel data writing is performed in memory region 55a in bank BA and memory region 55b# in bank BB by way of example.

It is assumed that, in memory region 55a, the data write current corresponding to write data WDT (at "L" level) is supplied to selected bit line BL. In this case, similarly to the above case, the current flows in a path from main power supply wiring PLmb#, via sub-power supply wiring PLsb#0, selected bit line and sub-power supply wiring PLsa#0, to main ground wiring GLmb#0, for supplying the power supply voltage from the other side. Therefore, no current path is formed for the power supply lines in selected memory region 55a. It is therefore possible to suppress erroneous write of data caused by the magnetic field noise.

In addition, it is assumed that in memory region 55b#, the data write current corresponding to write data WDT (at "H" level) is supplied to selected bit line BL. In this case, similarly to the above case, the current flows in a path from main power supply wiring PLma#1, via sub-power supply wiring PLsa#1, selected bit line and sub-power supply wiring PLsb#1, to main ground wiring GLma#1, for supplying the power supply voltage from one side. Due to this, no current path is formed for the power supply lines in selected memory region 55b#. It is therefore possible to suppress erroneous write of data caused by the magnetic field noise.

As can be seen, even in the case where a plurality of banks are provided in MRAM device 1 as in the configuration of the second modification of the first embodiment, no data write current is carried to the power supply lines which intersect with the selected memory region in each bank. It is therefore possible to prevent erroneous write of data following the magnetic field noise in the selected memory region.

Third Modification of First Embodiment

Figure 12:
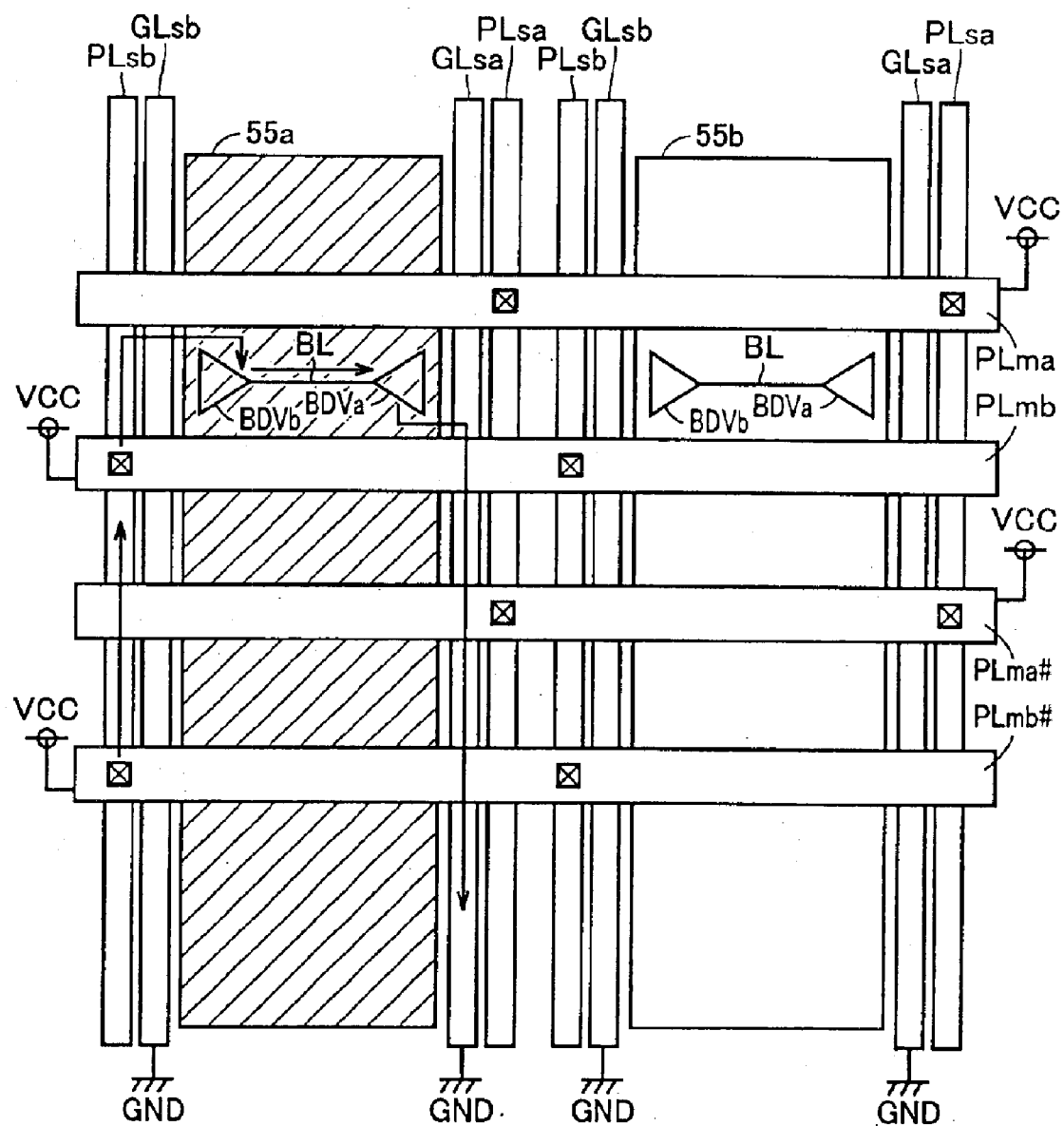
FIG. 12 is a conceptual diagram showing another arrangement of power supply lines for supplying power to the memory regions according to a third modification of the first embodiment.

Referring to FIG. 12, the configuration of a third modification of the first embodiment according to the present invention differs from that of the first embodiment described with reference to FIG. 5 in that main ground wirings GLma and GLmb are deleted and in that main power supply wirings PLma# and PLmb# are additionally arranged. Main power supply wiring PLma# supplies power supply voltage VCC from the same direction as that of main power supply wiring PLma, i.e., from one side, and is electrically coupled to sub-power supply wiring PLsa similarly to main power supply wiring PLma.

On the other hand, main power supply wiring PLmb# supplies power supply voltage VCC from the same direction as that of main power supply wiring PLmb, i.e., from the other side, and is electrically coupled to sub-power supply wiring PLsb similarly to main power supply wiring PLmb.

Further, sub-ground wirings GLsa and GLsb are directly, electrically coupled to ground voltage GND.

Now, description will be given of the flow of the data current corresponding to write data (at "L" level) to selected bit line BL in memory region 55a.

As shown in FIG. 12, power supply voltage VCC is supplied from main power supply wirings PLmb and PLmb# to bit line driver BDVb through sub-power supply wiring PLsb. Ground voltage GND is supplied to bit line driver BDVa from sub-ground wiring GLsa.

As a result, a desired data write current is generated for selected bit line BL and no data write current is carried to the power supply lines which intersect with selected memory region 55a.

Similarly to the above, it is possible to prevent erroneous write of data to unselected memory cells following the magnetic field noise.

In FIG. 12, the configuration is such that the two stages of two main power supply wirings that supply power supply voltage VCC from the same direction are provided. However, the present invention is not limited thereto. The data write current can be supplied using only one stage of two main power supply wirings PLma and PLmb.

By arranging two stages of two main power supply wirings as seen in the configuration of this modification, it is possible to suppress voltage drop caused by wiring resistance and sufficiently supply data write currents.

Figure 13:
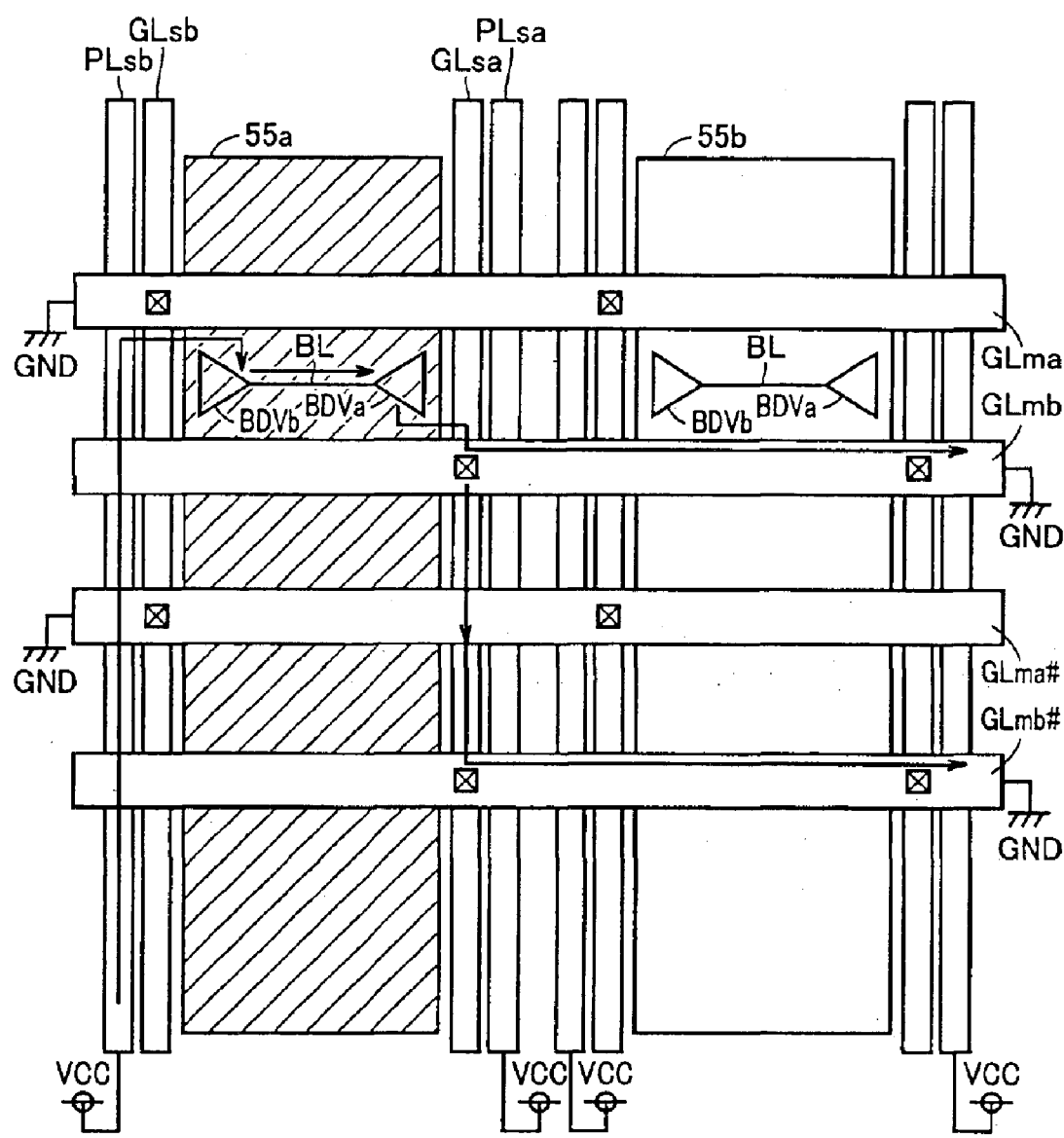
FIG. 13 is a conceptual diagram showing still another arrangement of power supply lines for supplying power to the memory regions according to the third modification of the first embodiment.

Referring to FIG. 13, another configuration of the third modification of the first embodiment differs from that shown in FIG. 12 in that main power supply wirings PLma, PLmb, PLma# and PLmb# are replaced by main ground wirings GLma, GLmb, GLma# and GLmb#, respectively, and in that sub-power supply wirings PLsa and PLsb are directly, electrically coupled to supply voltage VCC.

Main ground wirings GLma and GLma# supply ground voltage GND from the other side, and are electrically coupled to sub-ground wiring GLsb. Main ground wirings GLmb and GLmb# supply ground voltage GND from one side, and are electrically coupled to sub-ground wiring GLsa.

Description will be given of the flow of the data write current corresponding to write data (at "L" level) to selected bit line BL in memory region 55a.

As shown in FIG. 13, power supply voltage VCC is supplied from sub-power supply wiring PLsb to bit line driver BDVb. In addition, ground voltage GND is supplied from main ground wirings GLmb and GLmb# connected to sub-ground wiring GLsa to bit line driver BDVa.

As a result, a desired data write current is generated for selected bit line BL and no data write current is carried to the power supply lines which intersect with memory region 55a.

It is therefore possible to prevent erroneous write of data to prevent erroneous write of data to unselected memory cells following the magnetic field noise in the selected memory region similarly to the above.

Second Embodiment

In the first embodiment according to the present invention, the arrangement of the power supply lines that supply power supply voltage VCC and ground voltage GND to the bit line driver so as to supply the data write current to selected bit line BL has been described.

It is also necessary to supply power supply voltage VCC and ground voltage GND from the power supply lines to the driver that drives digit line DL for supplying a data write current. In this case, there is a probability that erroneous write is caused due to the magnetic field noise depending on the arrangement of the power supply lines.

In a second embodiment, a case of supplying power to digit line drivers in banks BA and BB from a common power supply line will be described, referring to FIG. 14.

As described above, row decoders are provided in each bank. Specifically, a row decoder 20a (not shown) and a row decoder 21a that perform row selection are provided in bank BA. In addition, a row decoder 20b (not shown) and a row decoder 21b that perform row selection are provided in bank BB. Description will be given herein while assuming that the word line/digit line driver band belong to the region of banks BA and BB.

Figure 14:
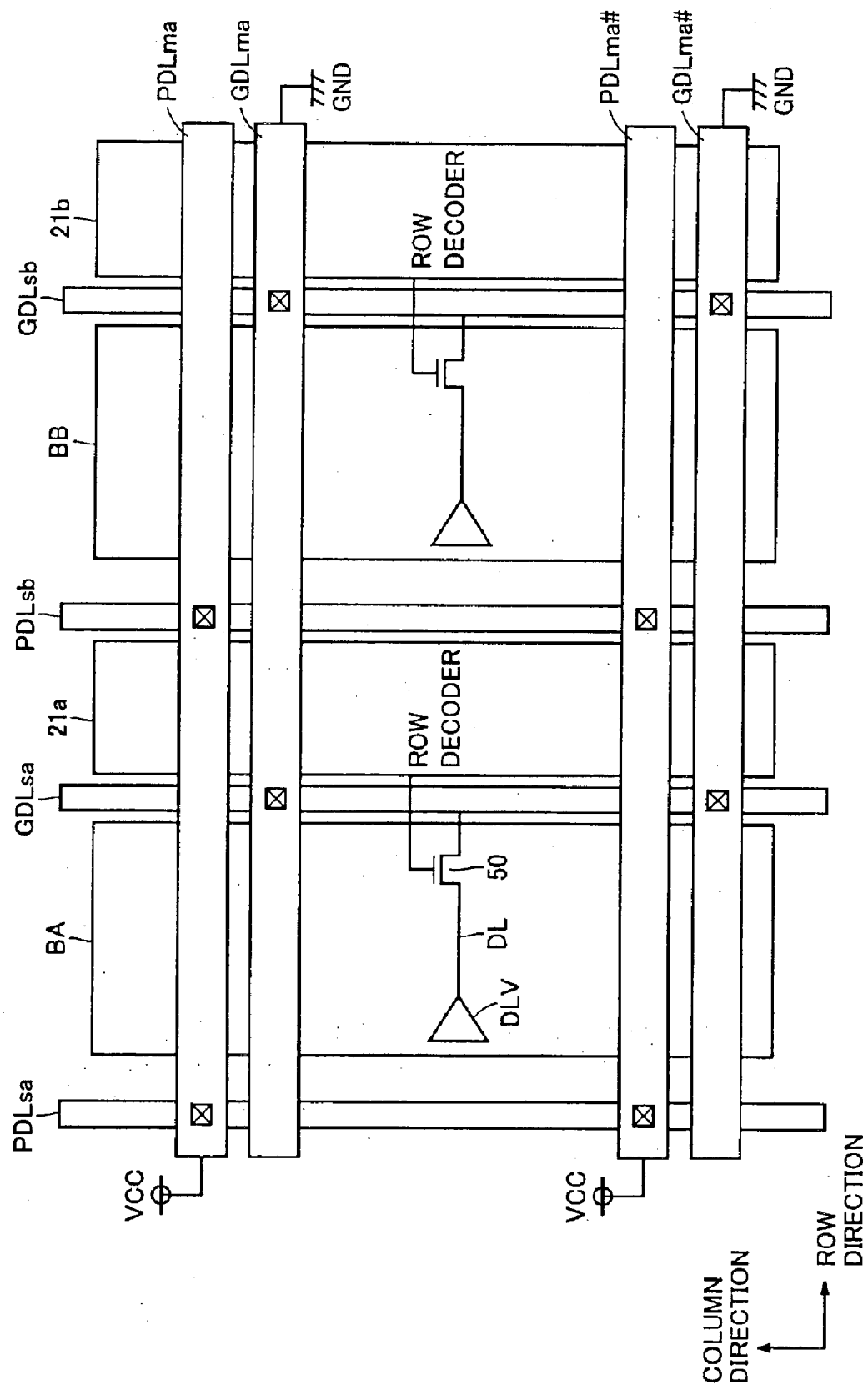
FIG. 14 is a conceptual diagram showing the arrangement of power supply lines for driving a digit line according to a second embodiment of the present invention.

FIG. 14 shows one digit line driver DLV provided in correspondence with the other side of digit line DL and one transistor 50 provided in correspondence with one side thereof in bank BA. Digit line driver DLV is activated in response to a row select result based on row addresses RA of row decoders 20a and 20b (not shown), and electrically couples the other end of digit line DL to a sub-power supply wiring PDLsa (PDLsb). Transistor 50 electrically couples one end of selected digit line DL to a sub-ground wiring GDLsa (GDLsb) in response to the row select result of row decoder 21a (20a). Accordingly, a data write current is carried to selected digit line DL.

Sub-ground wiring GDLsa supplied with ground voltage GND is arranged in correspondence with one side of bank BA in the column direction. Sub-power supply wiring PDLsa supplied with power supply voltage VCC is arranged in correspondence with the other side of bank BA in the column direction. Sub-ground wiring GDLsb supplied with ground voltage GND is arranged in correspondence with one side of bank BB in the column direction. Sub-power supply wiring PDLsb supplied with power supply voltage VCC is arranged in correspondence with the other side of bank BB in the column direction.

Further, main power supply wirings for supplying power supply voltage VCC to sub-power supply wirings PDLsa and PDLsb are arranged to intersect banks BA and BB in the row direction. In addition, main ground wirings for supplying ground voltage GND to sub-ground wirings GDLsa and GDLsb are arranged to intersect banks BA and BB in the row direction.

In the configuration of the second embodiment, main power supply wirings PDLma and PDLma# provided to supply power supply voltage VCC from the other sides of banks BA and BB and main ground wirings GDLma and GDLma# provided to supply ground voltage GND from one side of banks BA and BB are arranged in the column direction.

Main power supply wirings PDLma and PDLma# are electrically coupled to sub-power supply wirings PDLsa and PDLsb arranged on the other sides of banks BA and BB through contact holes, respectively. Main ground wirings GDLma and GDLma# are electrically coupled to sub-ground wirings GDLsa and GDLsb arranged on one sides of banks BA and BB through contact holes, respectively. With the configuration of the second embodiment, main power supply wirings PDLma and PDLmb are arranged in two stages. In addition, two main ground wirings GDLma and GDLmb are arranged in two stages.

Figure 15:
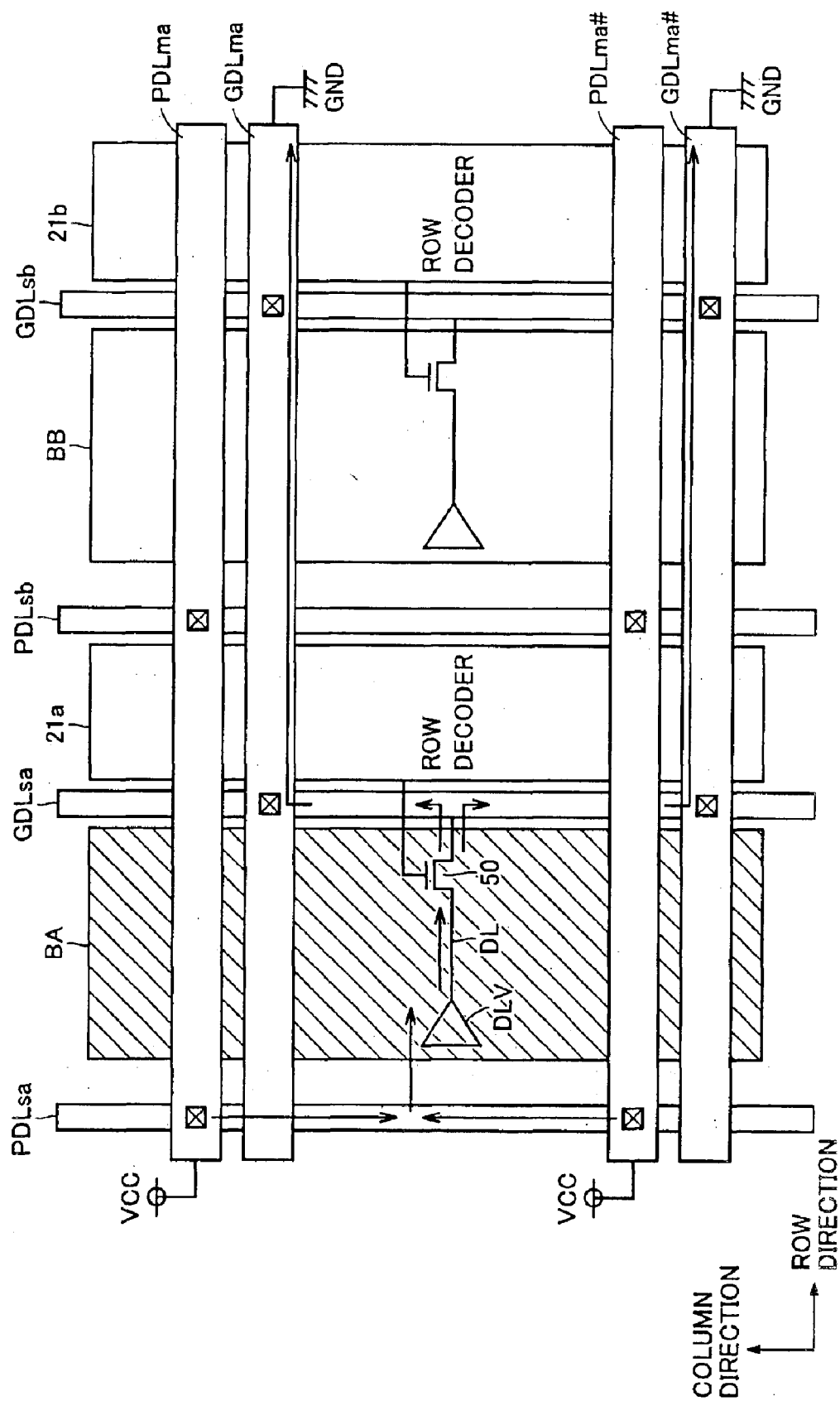
FIG. 15 is a conceptual diagram for describing a current path for the current carried to the power supply wirings when a digit line driver is activated in a bank described with reference to FIG. 14.

Referring to FIG. 15, description will be given of a current path for the current carried to the power supply wirings if digit line driver DLV is activated in bank BA described with reference to FIG. 14.

In the second embodiment, it is assumed that one of banks BA and BB is activated to operate.

Selected digit line driver DLV is supplied with power supply voltage VCC from sub-power supply wiring PLDsa. Transistor 50 activated by the row decoder is electrically coupled to sub-ground wiring GDLsa and supplied with ground voltage GND.

As a result, a data write current is carried to digit line DL in a direction from digit line driver DLV to transistor 50.

Therefore, no data current is generated for the power supply lines arranged in the direction intersecting with bank BA.

Consequently, no erroneous write of data to unselected memory cells in selected bank BA based on the magnetic field noise is caused.

While the main power supply wirings and main ground wirings are arranged in the two stages in the second embodiment, the present invention is not limited to this configuration. It is also possible to arrange the main power supply wiring and the main ground wiring in one stage.

Further, as described in the third modification of the first embodiment, it is also possible to eliminate either. the main power supply wirings or the main ground wirings for power supply voltage VCC or ground voltage GND and directly, electrically connect the sub-power supply wirings or the sub-ground wirings to power supply voltage VCC or ground voltage GND.

Only the power supply lines used for the digit line have been described in the second embodiment. Needless to say, a combination of the configuration of the first embodiment and that of the second embodiment may be used.

Modification of Second Embodiment

In a modification of the second embodiment of the present invention, description will be given of the arrangement of the power supply lines different from that of the power supply lines described in the second embodiment.

In this modification, a configuration which can facilitate the layout of row decoders will be described.

Figure 16:
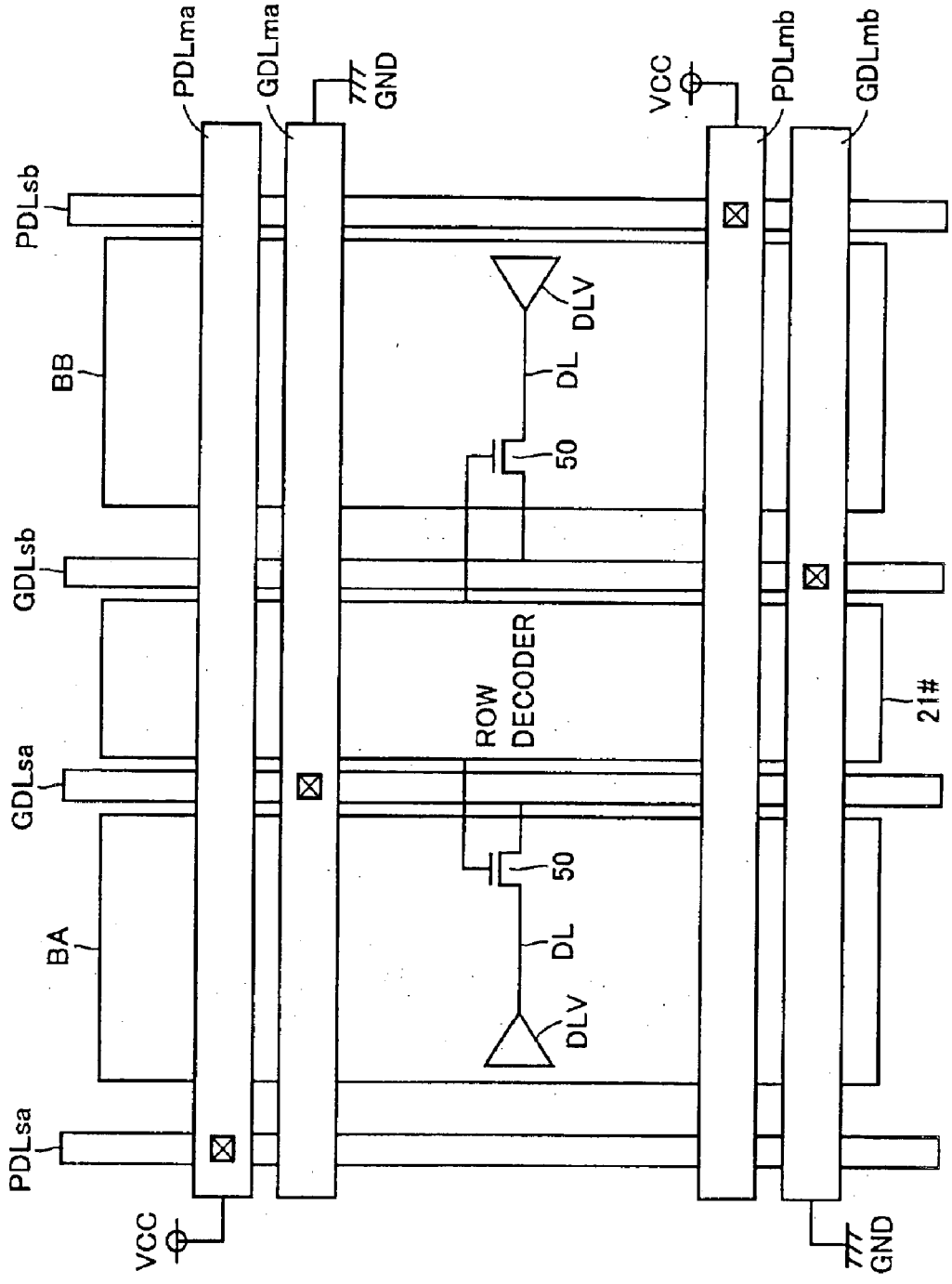
FIG. 16 is a conceptual diagram showing another arrangement of the power supply lines for driving the digit line according to the second embodiment of the present invention.

Referring to FIG. 16, the digit line drivers are arranged so that the direction of the flow of the data write current from digit line driver DLV in bank BB becomes opposite to that in bank BA.

Specifically, in bank BB, digit line driver DLV is arranged on one side of digit line DL, and transistor 50 is provided on the other side of digit line DL. Further, sub-power supply wiring PDLsb supplied with power supply voltage VCC is provided on one side of bank BB and a sub-ground wiring GDLsb supplied with ground voltage GND are provided.

Further, main power supply wiring PDLmb and ground wiring GDLmb are provided in place of main power supply wiring PDLma# and ground wiring GDLma#, respectively. Main power supply wiring PDLma for supplying power supply voltage VCC from the other side is electrically coupled to sub-power supply wiring PDLsa. Main ground wiring GDLma for supplying ground voltage GND from one side is electrically coupled to sub-ground wiring GDLsa. Main power supply wiring PDLmb for supplying power supply voltage VCC from one side is electrically coupled to sub-power supply wiring PDLsb. Main ground wiring GDLmb for supplying ground voltage GND from the other side is electrically coupled to sub-ground wiring GDLsb.

More specifically, digit line driver DLV provided on the other side of selected digit line DL in bank BA is supplied with the power supply voltage from the other side. Digit line driver DLV provided on one side of selected digit line DL in bank BB is supplied with the power supply voltage.

Accordingly, when bank BA is activated, a current path is formed for the selected digit line from the other side to one side through the power supply lines. On the other hand, when bank BB is activated, a current path is formed for the selected digit line from one side to the other side through the power supply lines. It is therefore possible to suppress erroneous write of data caused by the magnetic field noise.

Furthermore, in the modification of the second embodiment, row decoders 21# activating transistors 50 in banks BA and BB are arranged in regions adjacent banks BA and BB, respectively.

Compared with a case where row decoders 21 are arranged in each of banks BA and BB as described in the second embodiment, it is possible to reduce layout area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a plurality of memory regions, arranged in a column direction, each having a plurality of memory cells arranged in a matrix, wherein
   each of said memory regions includes:
   a plurality of bit lines provided in correspondence with memory cell columns, respectively;
   a first driver band arranged in a first direction of said plurality of bit lines, and supplied with power for supplying a data write current to at least one bit line among said plurality of bit lines; and
   a second driver band arranged in a second direction opposite to said first direction of said plurality of bit lines, and supplied with the power for supplying said data write current to at least one bit line among said plurality of bit lines,
   said thin film magnetic memory device further comprises:
   a first pair of power supply line, arranged in the column direction, for supplying the power to said first driver band from said first direction; and
   a second pair of power supply line, arranged in the column direction, for supplying the power to said second driver band from said second direction,
   each of said first and second pair of power supply lines includes first and second power lines supplying a first voltage and a second voltage, respectively, and
   when data is written, the first driver band corresponding to the selected memory region selected by an externally applied address designation among said plurality of memory regions is connected to one of the first and second power lines of said first pair of power supply line in accordance with written data, and the second driver band corresponding to said selected memory region is connected to the other one of said first and second power lines of said second pair of power supply line in accordance with said written data.

2. The thin film magnetic memory device according to claim 1, wherein
   said first power supply line is arranged to extend over said plurality of memory regions, and
   no current path is formed in a region of each of said first and second pair of power supply lines, which corresponds to said selected memory region selected from said plurality of memory regions.

3. The thin film magnetic memory device according to claim 1, wherein
   said data write current carried to at least one of said plurality of bit lines is equal in direction to said data write current carried to said first and second pair of power supply lines.

4. The thin film magnetic memory device according to claim 1, further comprising:
   first and second power supply terminals supplied with said first voltage; and
   third and fourth power supply terminals supplied with said second voltage, wherein
   said first and third power supply terminals are arranged in said first direction of said first pair of power supply line, and are connected to the first and second power lines of said first pair of power supply line, respectively, and
   said second and fourth power supply terminals are arranged in said second direction of said second pair of power supply line, and are connected to the first and second power lines of said second pair of power supply line, respectively.

5. The thin film magnetic memory device according to claim 1, wherein
   said data write current carried to the at least one bit line by said first or second driver flows in at least one of said first direction and said second direction.

6. The thin film magnetic memory device according to claim 1, wherein
   each of said memory regions is divided into a plurality of block regions in a row direction,
   said first driver band is divided into a plurality of first driver units corresponding to said plurality of block regions in the row direction, respectively,
   said second driver band is divided into a plurality of second driver units corresponding to said plurality of block regions in the row direction, respectively,
   said first and second pair of power supply lines are further provided for every group block regions constituting the same column in said plurality of memory regions,
   said written data includes data of a plurality of bits corresponding to said plurality of block regions, respectively, and
   in each of said block regions belonging to said selected memory region, the corresponding first driver unit is connected to one of the first and second power lines of said first pair of power supply line in accordance with the data of a corresponding bit among said plurality of bits, and the corresponding second driver unit is connected to the other one of said first and second power lines of said second pair of power supply line in accordance with the data of said corresponding bit among said plurality of bits.

7. The thin film magnetic memory device according to claim 6, wherein
   each said first pair of power supply line further includes a first sub-power supply line arranged in a direction in which the first sub-power supply line intersects with said first and second power lines, and provided for each of the first driver units corresponding to each of said block regions,
   each said second pair of power supply line further includes a second sub-power supply line arranged in a direction in which the second sub-power supply line intersects with said first and second power lines, and provided for each of the second driver units corresponding to each of said block regions,
   in each of said block regions belonging to said selected region, said corresponding first driver unit is connected to one of said first and second power lines through said first sub-power supply line corresponding to said each first driver unit, and
   said corresponding second driver unit is connected to the other one of said first and second power lines through said second sub-power supply line corresponding to said each second driver unit.

8. A thin film magnetic memory device comprising:
   a plurality of memory regions, arranged in a column direction, each having a plurality of memory cells arranged in a matrix, wherein
   each of said memory regions includes:
   a plurality of bit lines provided in correspondence with memory cell columns, respectively;
   a first driver band arranged in a first direction of said plurality of bit lines, and supplied with power for supplying a data write current to at least one bit line among said plurality of bit lines; and
   a second driver band arranged in a second direction opposite to said first direction of said plurality of bit lines, and supplied with the power for supplying said data write current to at least one bit line among said plurality of bit lines,
   said thin film magnetic memory device further comprises:
   a first power supply line, arranged in correspondence with said first driver band along the column direction, for supplying a first voltage from said first direction; and
   a second power supply line, arranged in correspondence with said second driver band along the column direction, for supplying a second voltage from said second direction,
   when data is written, one of the first and second driver bands corresponding to the selected memory region selected from said plurality of memory regions in accordance with written data is connected to one of the corresponding first and second power supply lines, and the other one of said corresponding first and second driver bands is electrically connected to the second voltage.

9. A thin film magnetic memory device comprising:
   a plurality of memory regions, arranged in a row direction, each having a plurality of memory cells arranged in a matrix, wherein
   each of said memory regions includes:
   a plurality of digit lines provided in correspondence with memory cell rows, respectively; and
   a digit line driver band arranged in a first direction of said plurality of digit lines, and supplied with a first voltage for supplying a data write current to at least one digit line selected from said plurality of digit lines,
   each of said digit lines is supplied with a second voltage from a second direction opposite to said first direction, and
   said thin film magnetic memory device further comprises a first power supply line, electrically coupled to said digit line driver band in the row direction, for supplying said first voltage from said first direction.

10. The thin film magnetic memory device according to claim 9, further comprising:
   a second power supply line supplying said second voltage from said second direction, wherein
   in each of said memory regions, said plurality of digit lines in said second direction are electrically coupled to said second power supply line.

11. A thin film magnetic memory device comprising:
   a plurality of memory regions, arranged in a column direction, each having a plurality of memory cells arranged in a matrix, wherein
   each of said memory regions includes:
   a plurality of bit lines provided in correspondence with memory cell columns, respectively;
   said thin film magnetic memory device further comprising:
      power supply lines for supplying power to a current driver for supplying a data write current to said bit lines, wherein
      said power supply lines are arranged to extend over said plurality of memory regions, and
      no current path is formed in a region of each of said power supply lines that corresponds to a selected memory region selected for a data write operation from said plurality of memory regions.

* * * * *